(12) United States Patent
Tan et al.

(10) Patent No.: US 9,343,587 B2
(45) Date of Patent: May 17, 2016

(54) FIELD EFFECT TRANSISTOR WITH SELF-ADJUSTING THRESHOLD VOLTAGE

(71) Applicant: GLOBALFOUNDRIES Singapore Pte. Ltd., Singapore (SG)

(72) Inventors: Shyue Seng Tan, Singapore (SG); Eng Huat Toh, Singapore (SG); Elgin Kiok Boone Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 157 days.

(21) Appl. No.: 13/774,731

(22) Filed: Feb. 22, 2013

(65) Prior Publication Data
US 2014/0239371 A1    Aug. 28, 2014

(51) Int. Cl.
| H01L 23/62  | (2006.01) |
| H01L 29/792 | (2006.01) |
| H01L 29/66  | (2006.01) |
| H01L 29/423 | (2006.01) |
| H01L 29/51  | (2006.01) |
| H01L 29/78  | (2006.01) |
| H01L 29/40  | (2006.01) |

(52) U.S. Cl.
CPC ........ *H01L 29/792* (2013.01); *H01L 29/42368* (2013.01); *H01L 29/513* (2013.01); *H01L 29/66681* (2013.01); *H01L 29/66833* (2013.01); *H01L 29/7816* (2013.01); *H01L 29/402* (2013.01); *H01L 29/516* (2013.01); *H01L 29/518* (2013.01); *H01L 29/66545* (2013.01); *H01L 29/66553* (2013.01)

(58) Field of Classification Search
USPC .................................. 438/286–287
See application file for complete search history.

(56) References Cited

U.S. PATENT DOCUMENTS

| 6,150,214 A * | 11/2000 | Kaeriyama ....... H01L 21/28518 |
| | | 257/295 |
| 7,008,832 B1 * | 3/2006 | Subramanian .... H01L 21/28114 |
| | | 257/E21.205 |
| 2011/0291206 A1* | 12/2011 | Mueller et al. ................ 257/412 |
| 2014/0048865 A1* | 2/2014 | Toh ................... H01L 21/28282 |
| | | 257/324 |

OTHER PUBLICATIONS

Kosuke Tatsumura et al., "Novel VTH Self-Adjusting MISFET with SiN Charge Trap Layer for Ultra Low Power LSI," Electron Devices Meeting, IEEE, 2011, pp. 4.2.1-4.2.4.

* cited by examiner

*Primary Examiner* — Ali Naraghi
(74) *Attorney, Agent, or Firm* — Ditthavong & Steiner, P.C.

(57) ABSTRACT

Methods for forming field effect transistors (FETs) with improved ON/OFF current ratios in addition to short charging times and the resulting devices are disclosed. Embodiments include forming a gate oxide layer above a channel region in a substrate, forming a partial self-adjusting threshold voltage layer above a drain-side end of the gate oxide layer, and forming a gate above the partial self-adjusting threshold voltage layer and the gate oxide layer.

3 Claims, 24 Drawing Sheets

FIELD EFFECT TRANSISTOR WITH SELF-ADJUSTING THRESHOLD VOLTAGE

TECHNICAL FIELD

The present disclosure relates to field effect transistors (FETs). The present disclosure is particularly applicable to forming laterally diffused metal oxide semiconductor (LDMOS) FETs with improved ON/OFF current ratios and short charging times.

BACKGROUND

Dynamic threshold voltage control improves the ON/OFF current ratio for a FET such that the threshold voltage can be low when the FET is on to provide a high current, and the threshold voltage can be high when the device is off to prevent leakage. Such dynamic threshold voltage control has been previously achieved through the use of body-bias. However, the various body-bias techniques incur additional costs such as for an additional power supply and a body bias control circuit, for a body contact for each FET, for additional wiring, a circuit for threshold voltage control, and three-dimensional (3-D) structures, or for introduction of ferroelectric materials to the CMOS platform. Recent attempts related to charge-trapping have further improved the ON/OFF current ratio. The additional improvements have led to an ON/OFF current ratio such that in an off state, a high threshold voltage gives a low current off and in an on state, a low threshold voltage give a high current on. In the case of FETs used in static random-access memory (SRAM), minimum voltages may be increased by 170 millivolts (mV) and active power (e.g., $C_{load}$ (capacitance load)*$V_{dd}^2$ (e.g., low supply voltage)) and standby power (e.g., $I_{off}$(current off)*$V_{dd}$/frequency) may be reduced. However, such improvements in the ON/OFF current ratio have resulted in charging times of microseconds, which lead to a low switching speed. Thus, resulting devices are only useful for power switches and field-programmable gate array switches.

A need therefore exists for methodology enabling formation of high performance FETs with short charging times and improved ON/OFF current ratios, and the resulting devices.

SUMMARY

An aspect of the present disclosure is an efficient method for fabricating self-adjusting threshold voltage FETs.

Another aspect of the present disclosure is a FET with self-adjusting threshold voltage.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a gate oxide layer above a channel region in a substrate; forming a partial self-adjusting threshold voltage layer above a drain-side end of the gate oxide layer; and forming a gate above the partial self-adjusting threshold voltage layer and the gate oxide layer.

An aspect of the present disclosure includes forming the partial self-adjusting threshold voltage layer above a source-side end and the drain-side end of the gate oxide layer. Other aspects of the present disclosure include forming the partial self-adjusting threshold voltage layer by: forming a self-adjusting threshold voltage layer above the gate oxide layer; and removing at least a middle portion of the self-adjusting threshold voltage layer. Another aspect includes masking the self-adjusting threshold voltage layer with a hardmask, exposing the middle portion of the self-adjusting threshold voltage layer, prior to removing the middle portion of the self-adjusting threshold voltage layer. Additional aspects include forming a dummy gate on the self-adjusting threshold voltage layer; forming an inter-layer dielectric (ILD) surrounding the gate oxide layer, the self-adjusting threshold voltage layer, and the dummy gate; removing the dummy gate, forming a cavity; and depositing a gate material on side surfaces of the cavity, leaving exposed the middle portion of the self-adjusting threshold voltage layer, prior to removing the middle portion of the self-adjusting threshold voltage layer. Further aspects include forming the partial self-adjusting threshold voltage layer by: forming a dummy gate on the gate oxide layer; forming ILD surrounding the gate oxide layer and the dummy gate; removing the dummy gate, forming a cavity; and depositing a self-adjusting threshold voltage material on side surfaces of the cavity.

Another aspect of the present disclosure is a device including: a source and a drain at opposite ends of a channel region within a substrate; a gate oxide layer on the substrate above the channel region; a partial self-adjusting threshold voltage layer above a drain-side end of the gate oxide layer; and a gate above the partial self-adjusting threshold voltage layer and the gate oxide layer.

An aspect of the device includes the partial self-adjusting threshold voltage layer being above a source-side end and the drain-side end of the gate oxide layer. An additional aspect includes the partial self-adjusting threshold voltage layer formed to a thickness of 1 to 10 nanometer (nm) and a width of 5 to 20 percent (%) a width of the gate oxide layer. Another aspect includes the partial self-adjusting threshold voltage layer formed of at least one of a dielectric material and a ferroelectric material. Yet another aspect includes the partial self-adjusting threshold voltage layer being formed of silicon nitride (SiN). Another aspect includes ILD surrounding the gate oxide layer, the partial self-adjusting threshold voltage layer, and the gate, wherein the partial self-adjusting threshold voltage layer is formed as spacers between the ILD and the gate.

According to the present disclosure, additional technical effects may be achieved in part by a method including: forming a gate oxide layer above a channel region in a substrate; forming a gate above the gate oxide layer; forming ILD surrounding the gate oxide layer and the gate; removing a portion of the gate exposing a portion of the gate oxide layer and forming a cavity between the ILD, the gate oxide layer, and remaining gate; forming a partial self-adjusting threshold voltage layer above the exposed portion of the gate oxide layer; and forming a field plate in a remainder of the cavity.

An additional aspect includes conformally depositing the partial self-adjusting threshold voltage layer on side and bottom surfaces of the cavity. Yet another aspect includes forming the partial self-adjusting threshold voltage layer to a thickness of 1 to 10 nm. Another aspect includes removing 10 to 30% horizontally of the gate down to the gate oxide layer, forming the cavity.

Another aspect of the present disclosure is a device including: a substrate; a channel region within the substrate; a gate oxide layer above the channel region; a gate above a first portion of the gate oxide layer, leaving exposed a second portion of the gate oxide layer; a partial self-adjusting threshold voltage layer above the second portion of the gate oxide layer; a field plate above the partial self-adjusting threshold voltage layer; and ILD surrounding the gate oxide layer, the gate, the partial self-adjusting threshold voltage layer, and the field plate.

An additional aspect of the device includes the partial self-adjusting threshold voltage layer conformally lining a cavity formed between the gate, the gate oxide layer, and the ILD. Yet another aspect includes the partial self-adjusting threshold voltage layer formed to a thickness of 1 to 10 nm. Yet another aspect includes the partial self-adjusting threshold voltage layer over 10 to 30% of a surface of the gate and the partial self-adjusting threshold voltage layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of long charging times (e.g., microsecond charging times) attendant upon increasing current ON/OFF ratios for FETs. In accordance with embodiments of the present disclosure, FETs are formed with a partial self-adjusting threshold voltage layer.

Methodology in accordance with embodiments of the present disclosure includes forming a gate oxide layer above a channel region in a substrate. Next, a partial self-adjusting threshold voltage layer is formed above a drain-side end of the gate oxide layer. Subsequently, a gate is formed above the partial self-adjusting threshold voltage layer and the gate oxide layer.

Methodology in accordance with other embodiments of the present disclosure includes forming a gate oxide layer above a channel region in a substrate. Then, a gate is formed above the gate oxide layer. Next, ILD is formed surrounding the gate oxide layer and the gate. After forming the ILD, a portion of the gate is removed exposing a portion of the gate oxide layer and forming a cavity between the ILD, the gate oxide layer, and the remaining gate. Then, a partial self-adjusting threshold voltage layer is formed above the exposed portion of the gate oxide layer. Afterwards, a field plate is formed in the remainder of the cavity.

Figure 1:
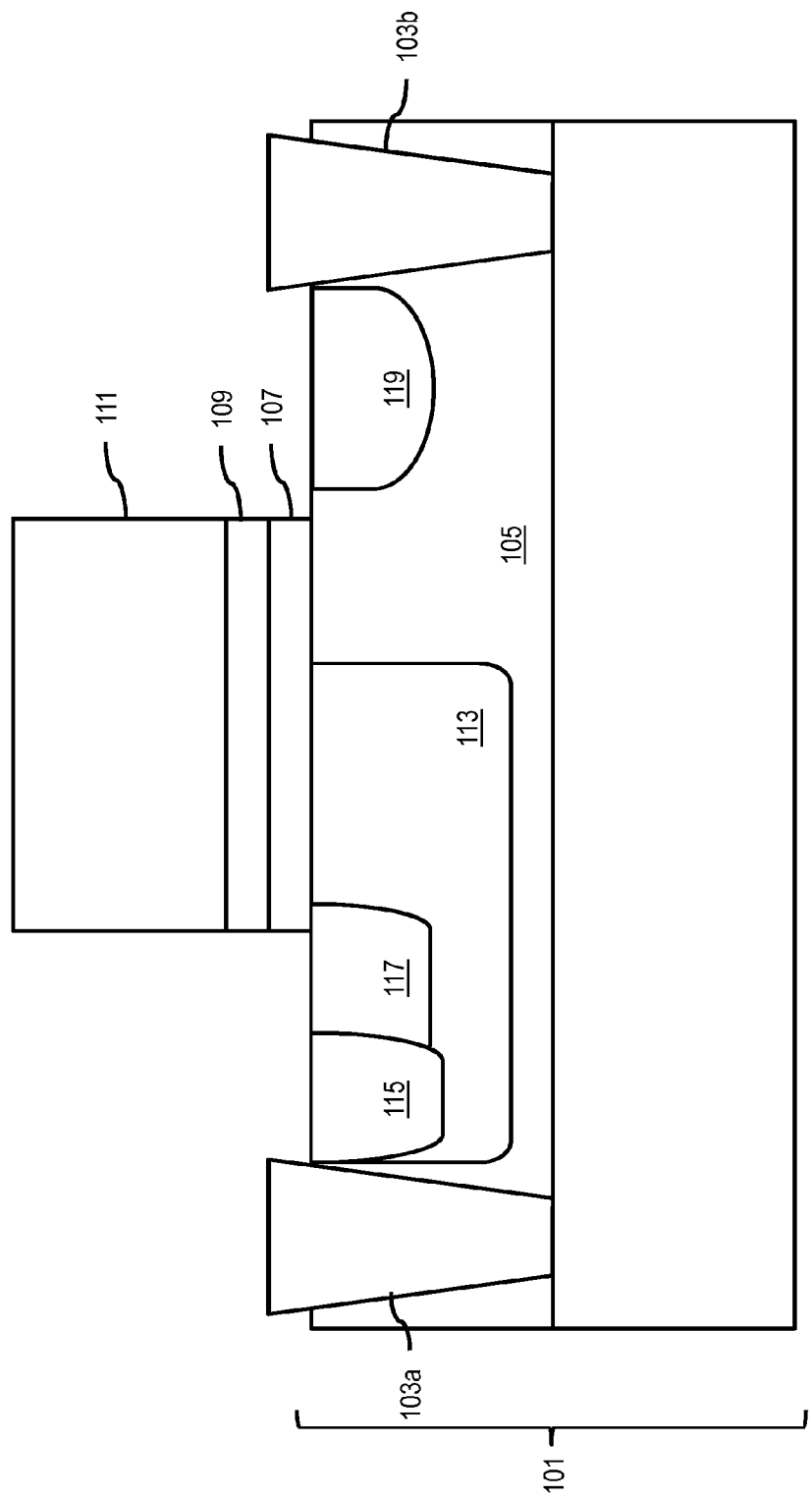
FIGS. 1 through 5B schematically illustrate a method for forming self-adjusting threshold voltage FET structures, in accordance with exemplary embodiments.
Figure 2:
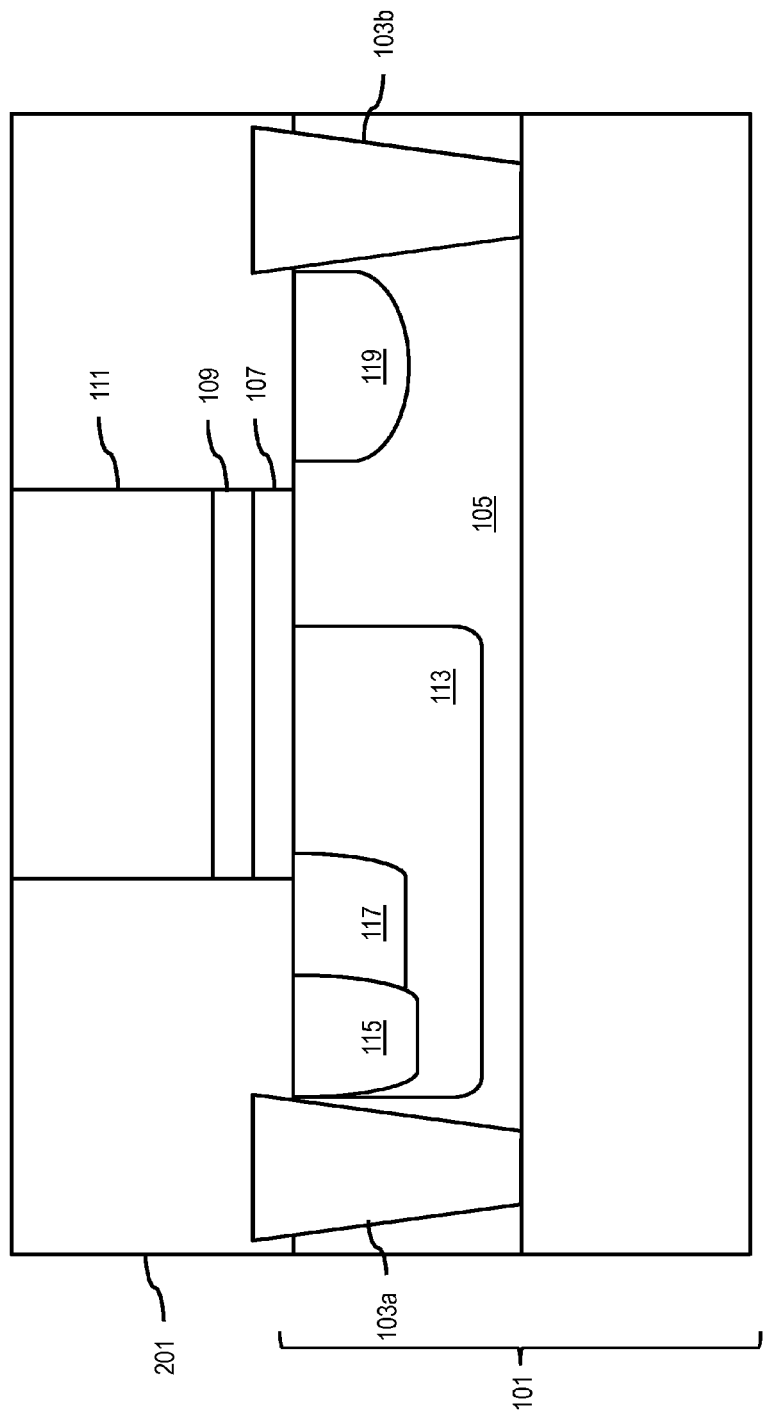

Adverting to FIG. 1, a method for forming a FET with a partial self-adjusting threshold voltage layer, according to an exemplary embodiment, begins with a substrate 101, for example a p-type silicon substrate. At least partially buried within the substrate are two shallow trench isolation (STI) regions 103a and 103b (collectively referred to as STI regions 103). Between the STI regions 103 is an $n^-$ drift region 105, e.g. an epitaxially formed n-well. Within the drift region 105 may be a $p^-$ doped buried body 113. Above regions 105 and 113, on a top surface of the substrate 101, a dummy gate stack is formed, including a gate oxide layer 107, a self-adjusting threshold voltage layer 109, and a dummy gate 111. The gate oxide layer may be formed of any type of gate oxide material, such as silicon dioxide ($SiO_2$), and may be formed to a thickness of 25 to 100 nm. The self-adjusting threshold voltage layer 109 may be formed of a gate dielectric material, such as SiN, and/or a ferroelectric material, and may be formed to a thickness of 1 to 10 nm. After the dummy gate stack is formed, lightly doped drain regions (not shown for illustrative convenience) may optionally be formed. Then, using gate spacers (also not shown for illustrative convenience), a drain region 119 and a source region 117, both $n^+$ regions, and a $p^+$ region 115, may be formed. According to the structure illustrated in FIG. 1, no pre-doping is required.

Next, ILD 201 is formed over the substrate 101, the STI regions 103 and the dummy gate 111. The ILD 201 may be formed of any ILD material, such as $SiO_2$. After forming the ILD 201, chemical mechanical polishing (CMP) may be performed to expose the dummy gate 111 and to form a top surface of the ILD 201 co-planar with the dummy gate 111.

Adverting to FIG. 3, the dummy gate 111 is subsequently removed to form a cavity 301 and expose the self-adjusting threshold voltage layer 109. The dummy gate 111 may be removed by any process that does not affect the self-adjusting threshold voltage layer 109. Next, at least a middle portion of the self-adjusting threshold voltage layer 109 is removed, as illustrated in FIG. 4. The self-adjusting threshold voltage layer 109 may be masked with a hardmask (not shown for illustrative convenience) that exposes the middle portion of the layer 109 for subsequent removal, such as by etching. Removing at least the middle portion of the self-adjusting threshold voltage layer 109 forms a partial self-adjusting threshold voltage layer 401. As illustrated, the partial self-adjusting threshold voltage layer 401 may include segments 401a and 401b that may be near the source region 117 and the drain region 119, respectively. Each of the segments 401a and 401b may be 5 to 20% the total width of the cavity 301.

Figure 5A:
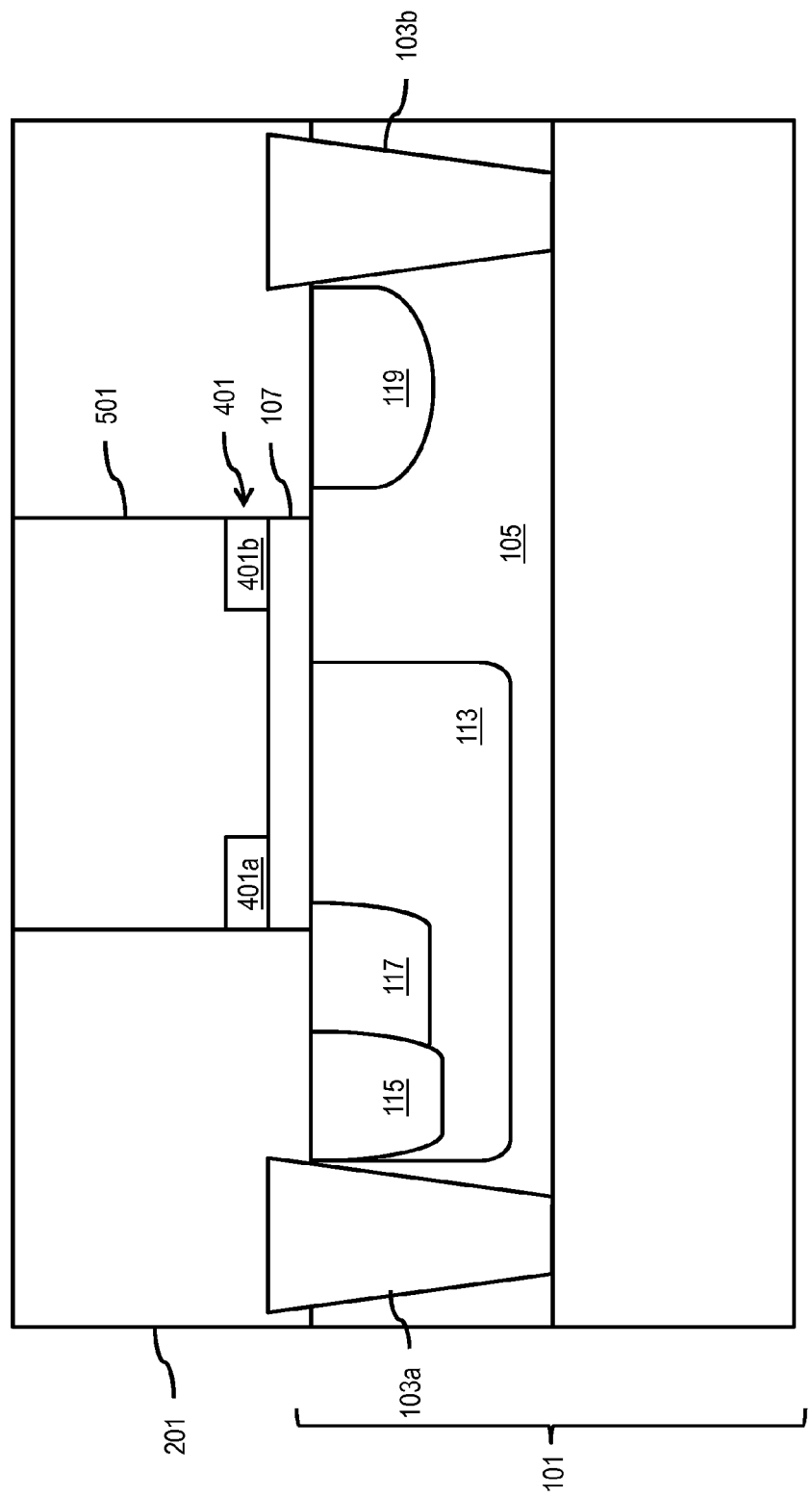

As illustrated in FIG. 5A, the cavity 301 is filled with a gate material to form a gate 501. The gate material may be poly-silicon (poly-Si) or metal. After depositing the gate material, CMP may be used to make the top surface of the gate 501 co-planar with the ILD 201.

Figure 5B:
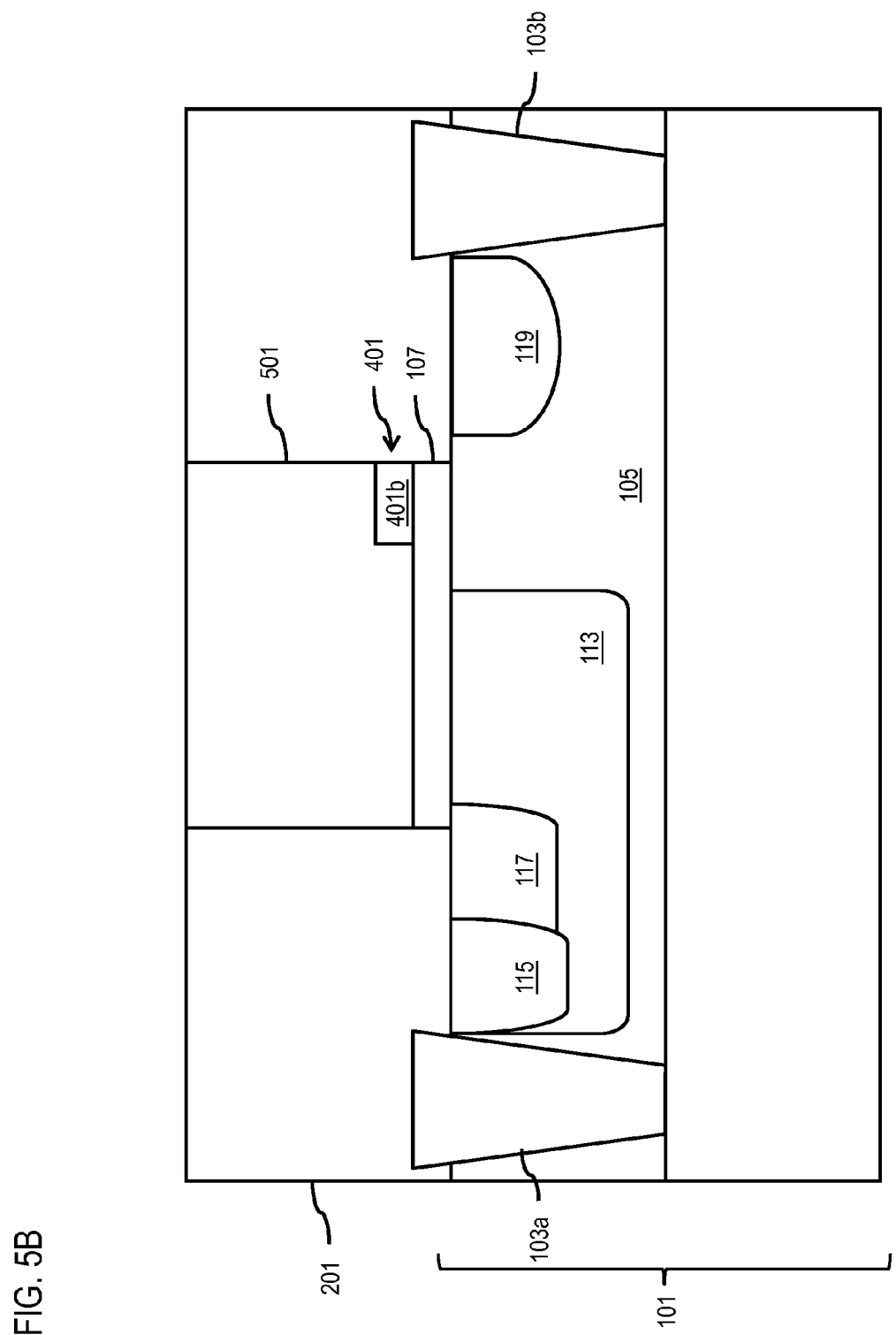

FIG. 5B illustrates an alternative structure in which a middle portion and the portion of the self-adjusting threshold voltage layer 109 near the source region 117 may be removed, forming the partial self-adjusting threshold voltage layer 401 with only the segment 401b associated with the drain region 119. Thus, a hardmask may cover only the portion of the self-adjusting threshold voltage layer 109 that corresponds with the segment 401b to form the partial self-adjusting threshold voltage layer 401. Accordingly, the processes associated with forming the structures illustrated in FIGS. 5A and 5B are compatible with current gate-last complementary metal-oxide-semiconductor (CMOS) processes with one extra masking step for partial self-adjusting threshold voltage layer removal. After forming the structures illustrated in FIGS. 5A and 5B, additional back-end-of-the-line (BEOL) process steps may be performed.

Figure 3:
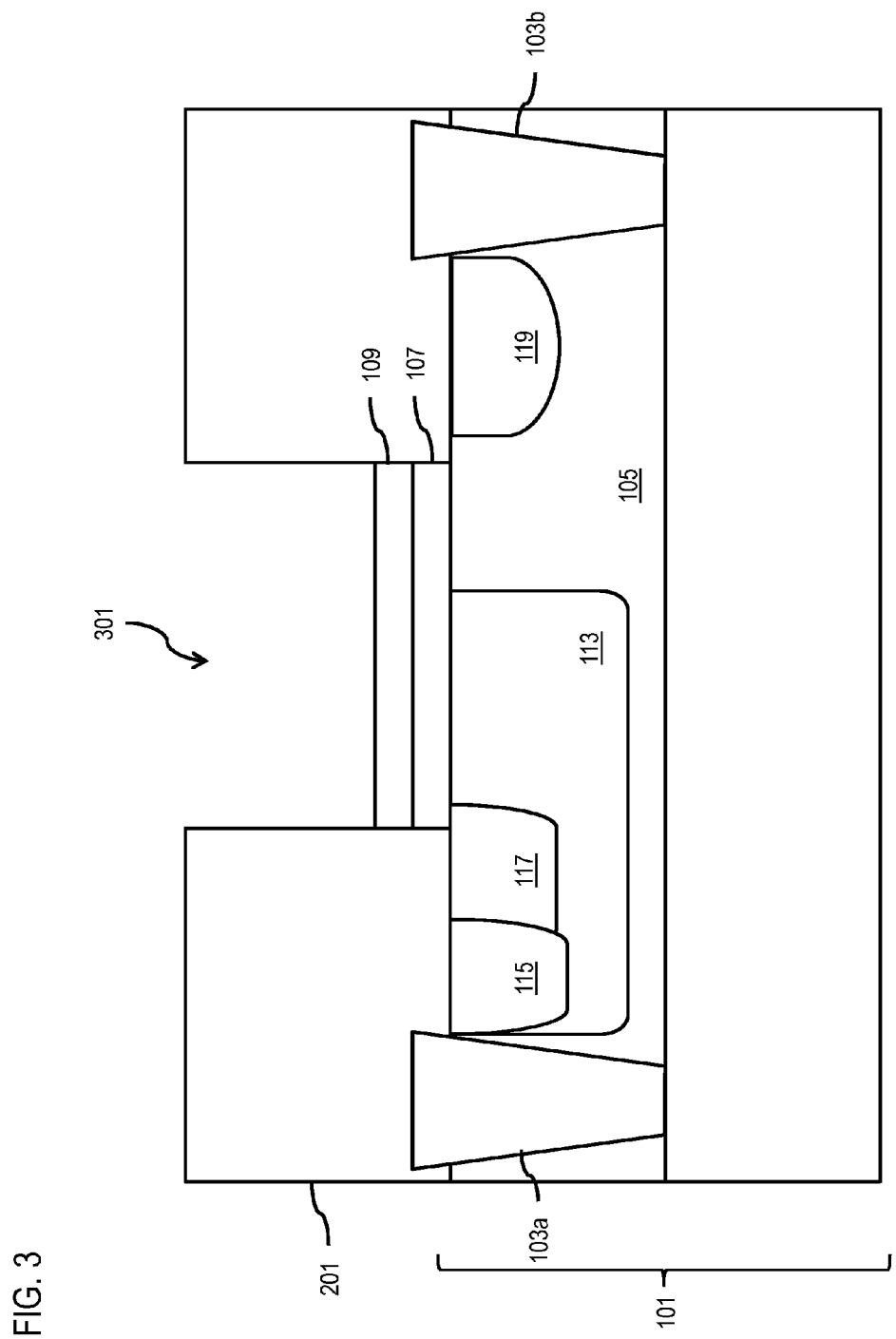
Figure 4:
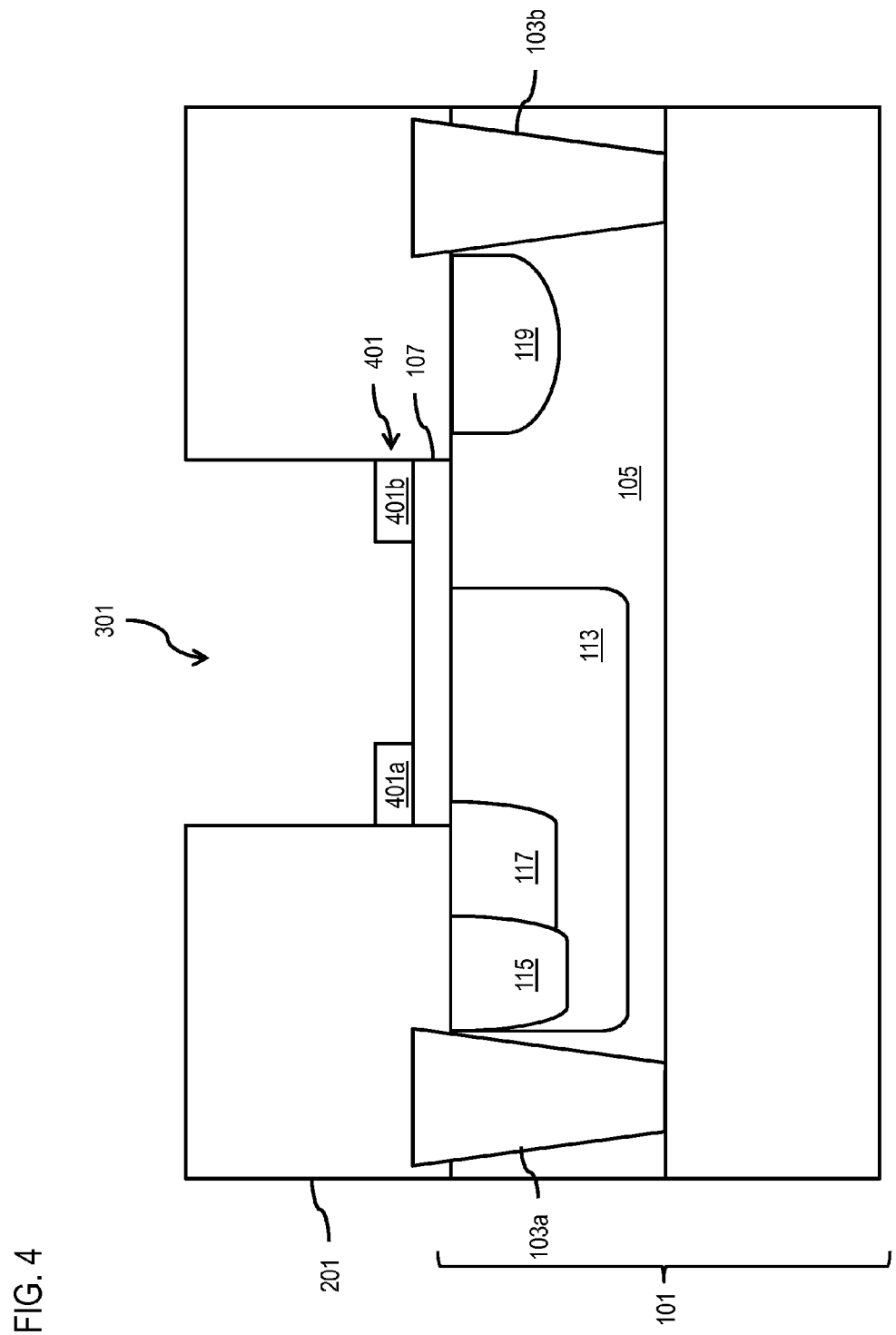
Figure 6:
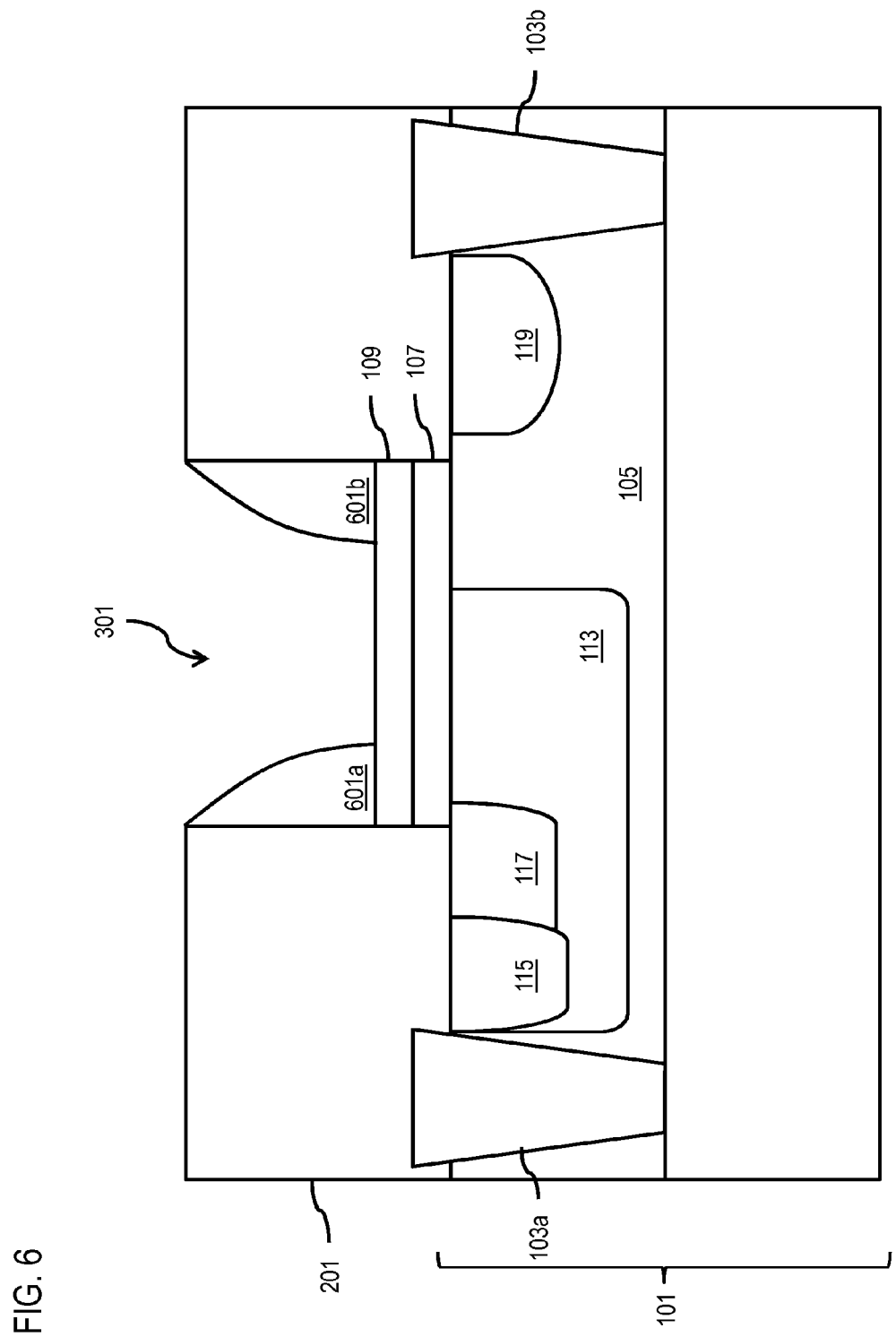
FIGS. 6 through 8 schematically illustrate a method for forming an alternative self-adjusting threshold voltage FET structure, in accordance with an exemplary embodiment.

Adverting to FIG. 6, a method for forming a FET with a partial self-adjusting threshold voltage layer, according to another exemplary embodiment, begins substantially as discussed above, through formation of the structure illustrated in FIG. 3. Next, spacers 601a and 601b (collectively referred to as spacers 601) may be formed on side surfaces of the cavity 301 against the ILD 201 and above the self-adjusting threshold voltage layer 109. The spacers 601 may be formed of a gate material, such as poly-Si or metal. The spacers 601 may be used in place of a hardmask for removing at least the middle portion of the self-adjusting threshold voltage layer 109, by leaving exposed the middle portion.

Figure 7:
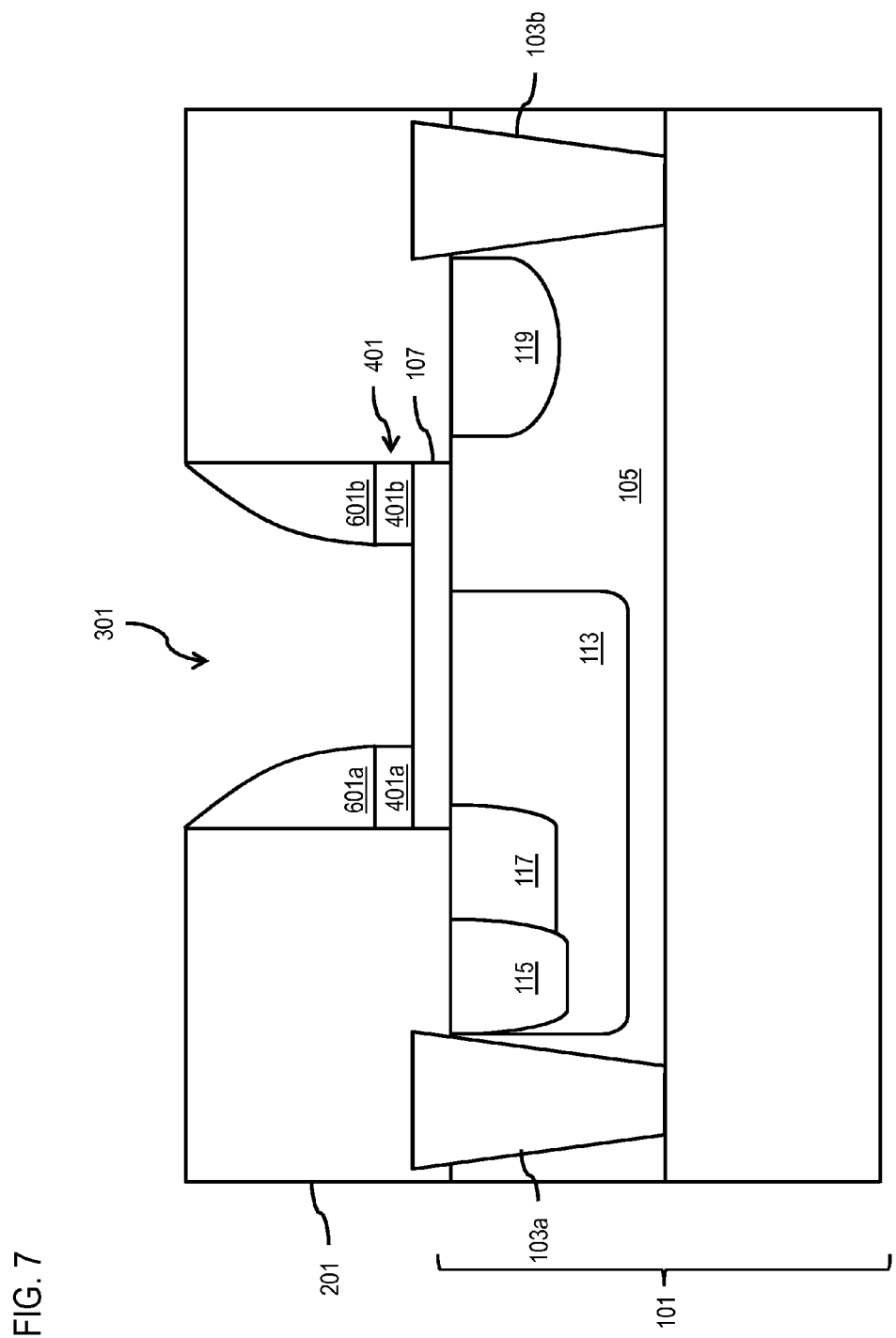
Figure 8:
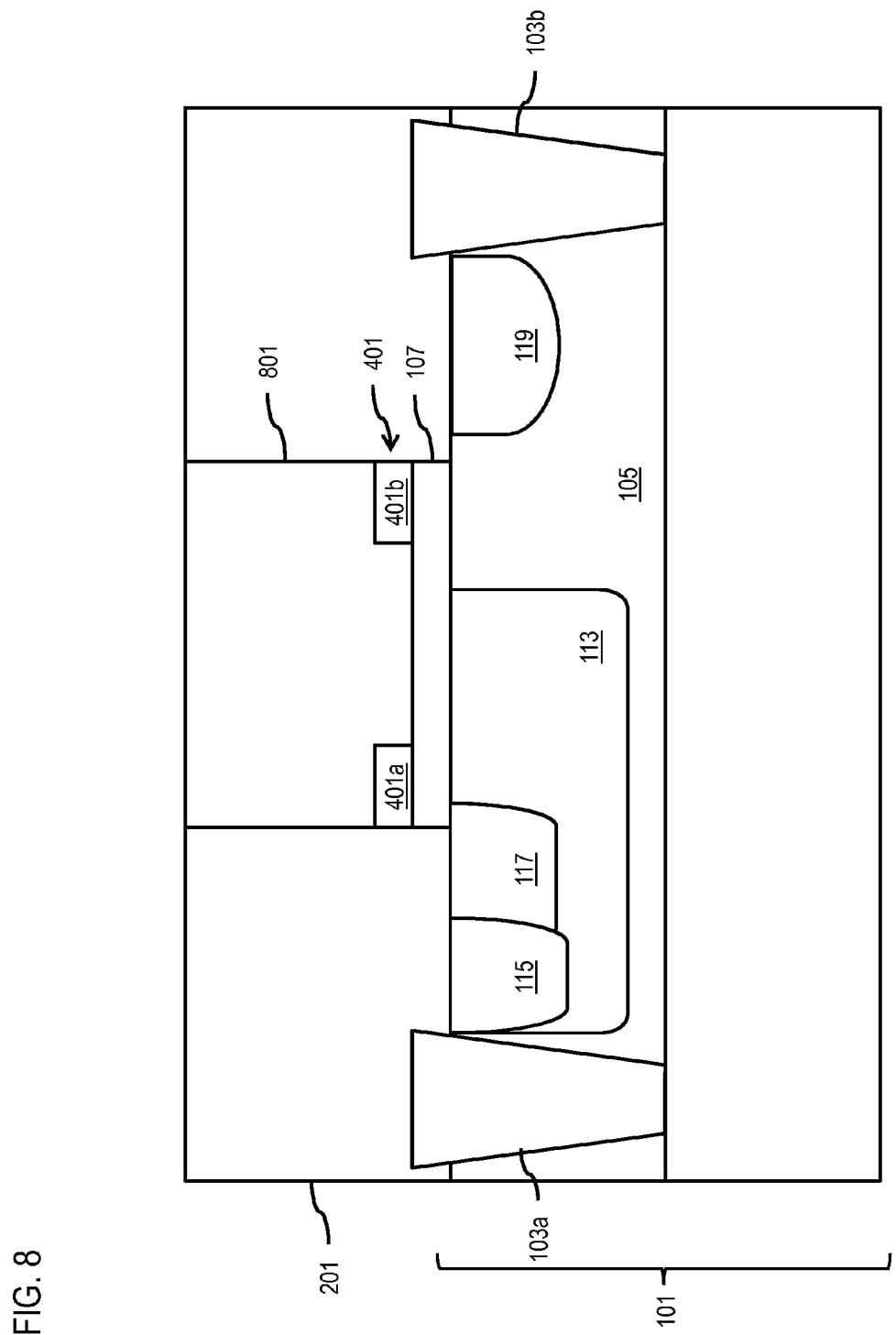

Next, as illustrated in FIG. 7, the middle portion of the self-adjusting threshold voltage layer 109 is removed, forming the partial self-adjusting threshold voltage layer 401. As illustrated, the partial self-adjusting threshold voltage layer 401 may include the segments 401a and 401b that may be near the source region 117 and drain region 119, respectively. The remaining cavity 301 is filled with a gate material to form the gate 801. The gate material is the same gate material as that used for forming the spacers 601, such as poly-silicon or metal. As before, after depositing the gate material, CMP may be used to make the top surface of the gate 801 co-planar with the ILD 201. Then, additional back-end-of-the-line (BEOL) process steps may be performed.

Figure 9:
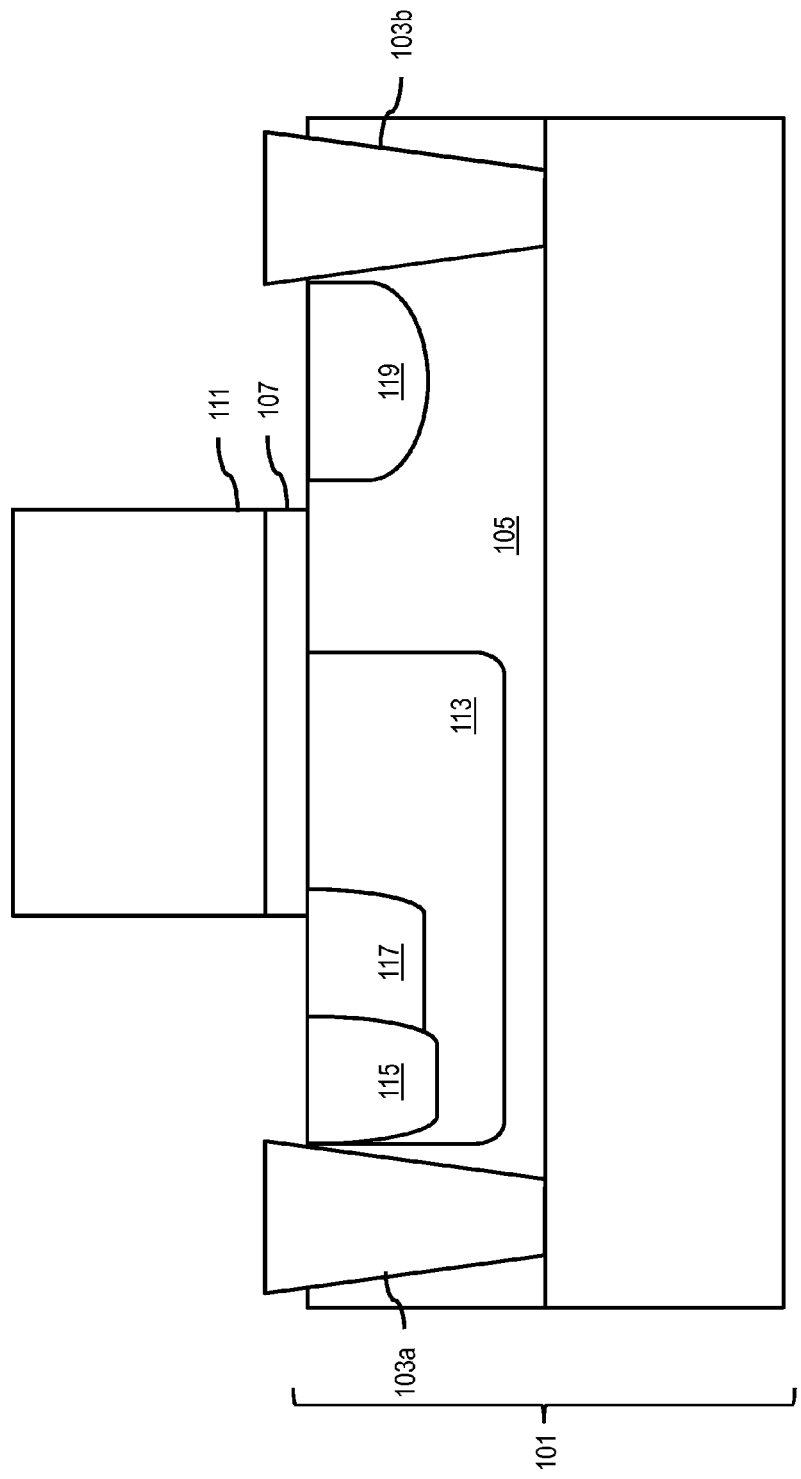
FIGS. 9 through 13 illustrate a method for forming another alternative self-adjusting threshold voltage FET structure, in accordance with an exemplary embodiment.

Adverting to FIG. 9, a method for forming a FET with a partial self-adjusting threshold voltage layer, according to another exemplary embodiment, begins with the substrate 101, the STI regions 103 and the gate oxide layer 107, as discussed with respect to FIG. 1. However, the dummy gate 111 is formed directly on the gate oxide layer 107. The gate oxide layer 107 may be formed of any type of gate oxide material, such as $SiO_2$, and may be formed to a thickness of 25 to 100 nm. After forming the dummy gate 111, the drain region 119, the source region 117, and the $p^+$ region 115 may be formed, as described above.

Figure 10:
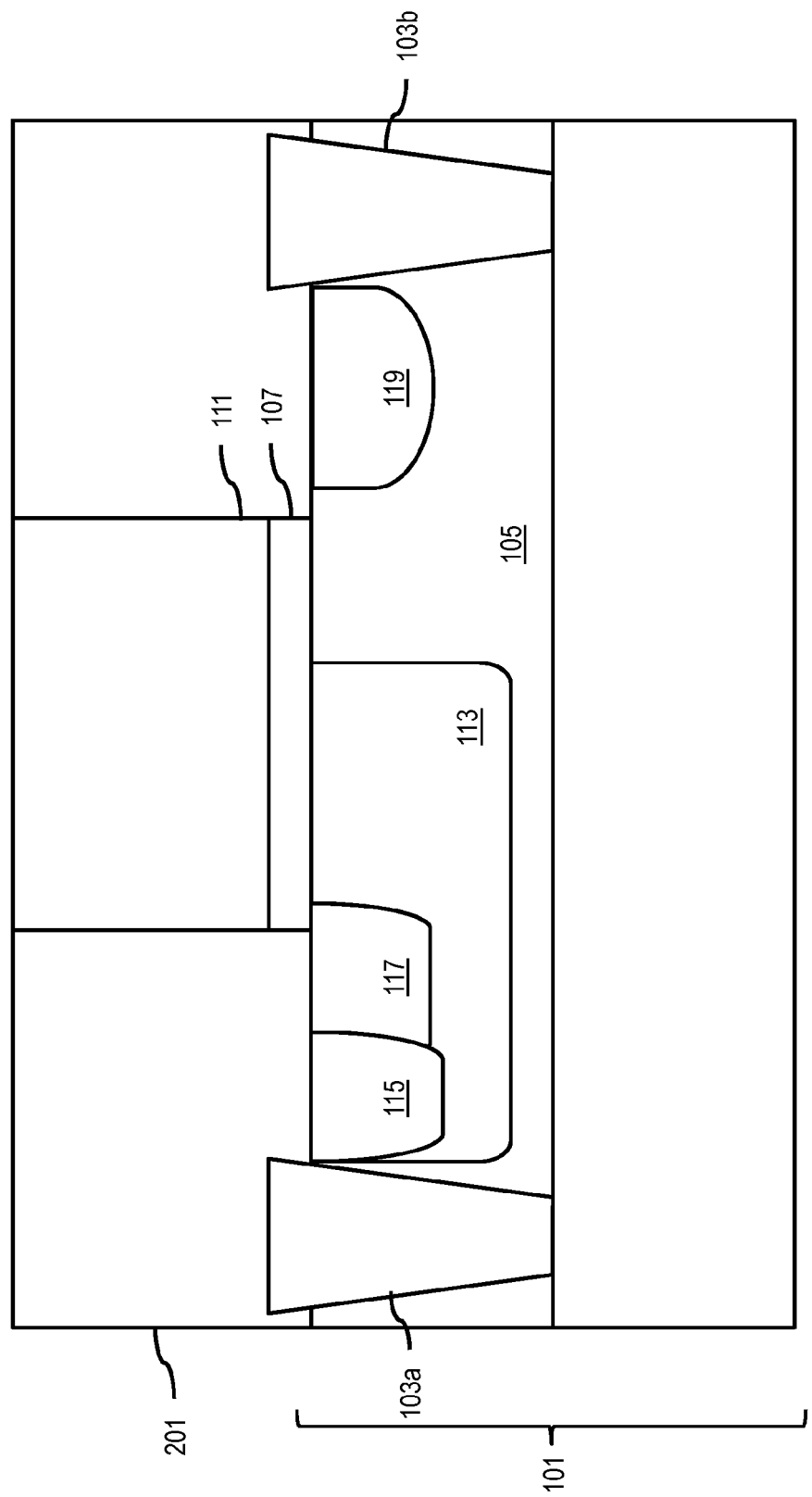

Next, ILD 201 is formed over the substrate 101, the STI regions 103 and the dummy gate 111, as illustrated in FIG. 10. The ILD 201 may be formed of any ILD material. After forming the ILD 201, CMP may be used to expose the dummy gate 111 and to form a top surface of the ILD 201 co-planar with the dummy gate 111.

Figure 11:
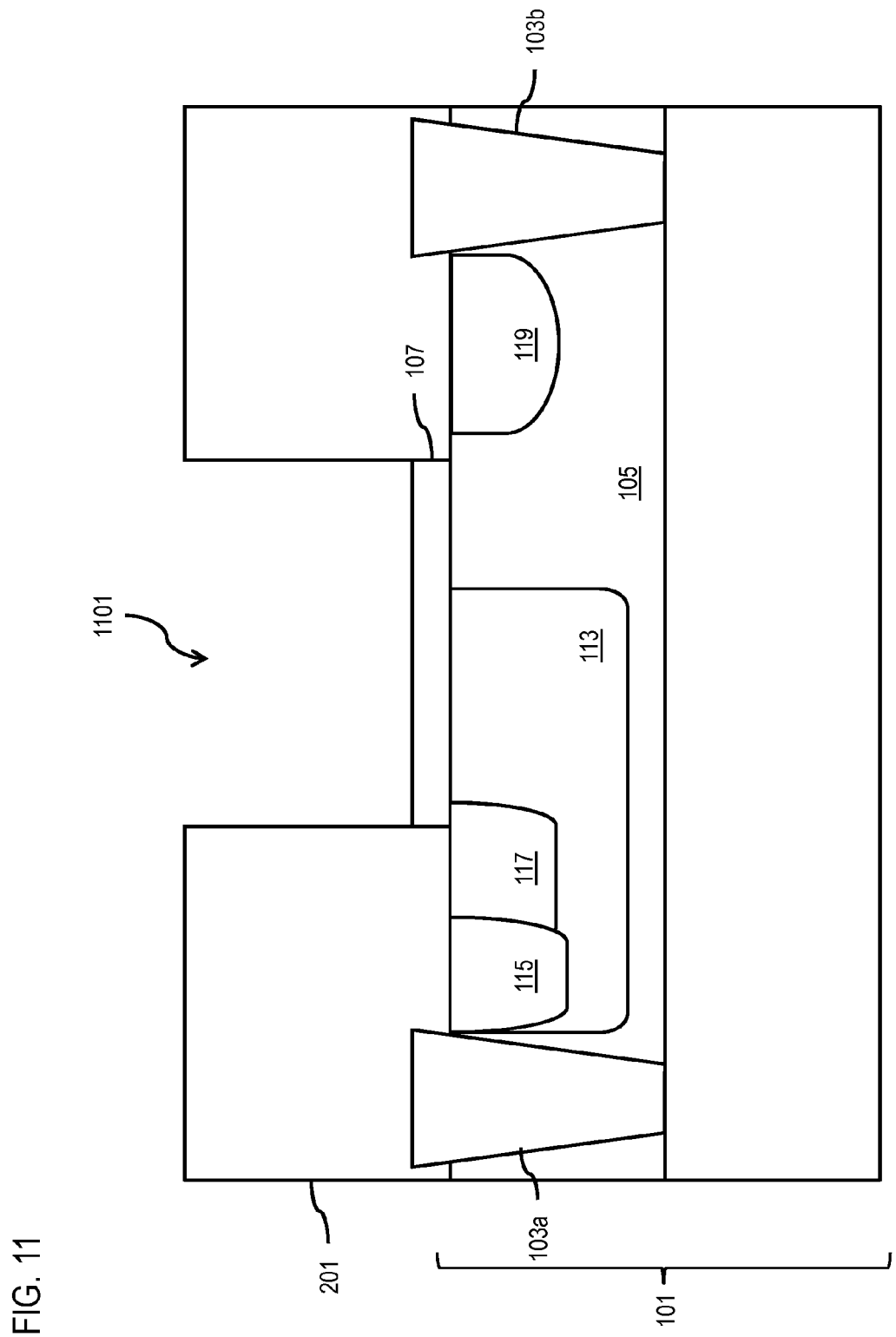
Figure 12:
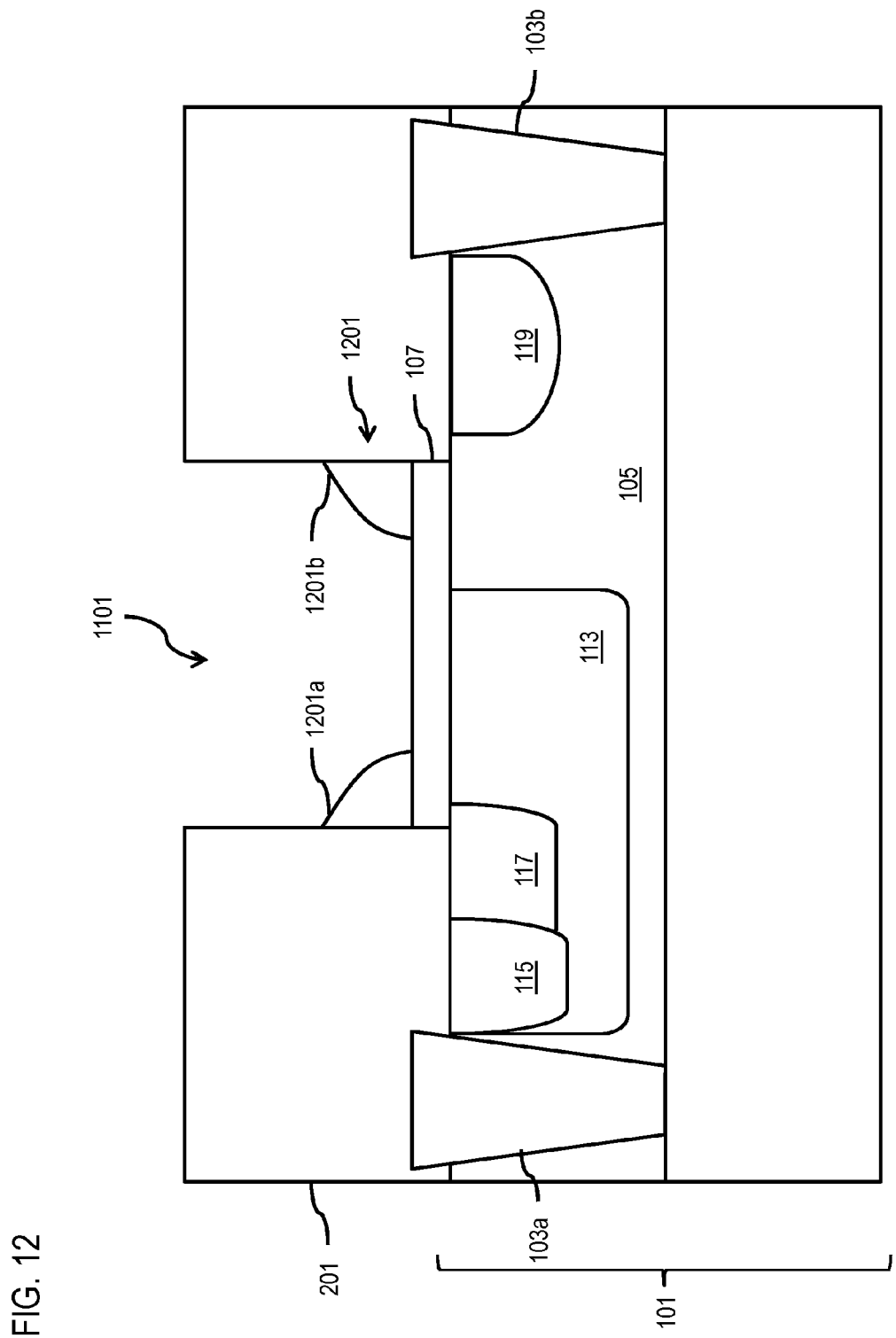

Adverting to FIG. 11, the dummy gate 111 is subsequently removed to form a cavity 1101 and expose the gate oxide layer 107. Next, a gate dielectric material (e.g., SiN) and/or a ferroelectric material may be deposited at the bottom corners of the cavity 1101 (against ILD 201 and gate oxide layer 107), as illustrated in FIG. 12. Depositing the gate dielectric and/or ferroelectric material forms a partial self-adjusting threshold voltage layer 1201. As illustrated, the partial self-adjusting threshold voltage layer 1201 includes segment portions 1201a and 1201b. However, as discussed above, the partial self-adjusting threshold voltage layer 1201 may be formed with just the segment 1201b associated with the drain region 119.

Figure 13:
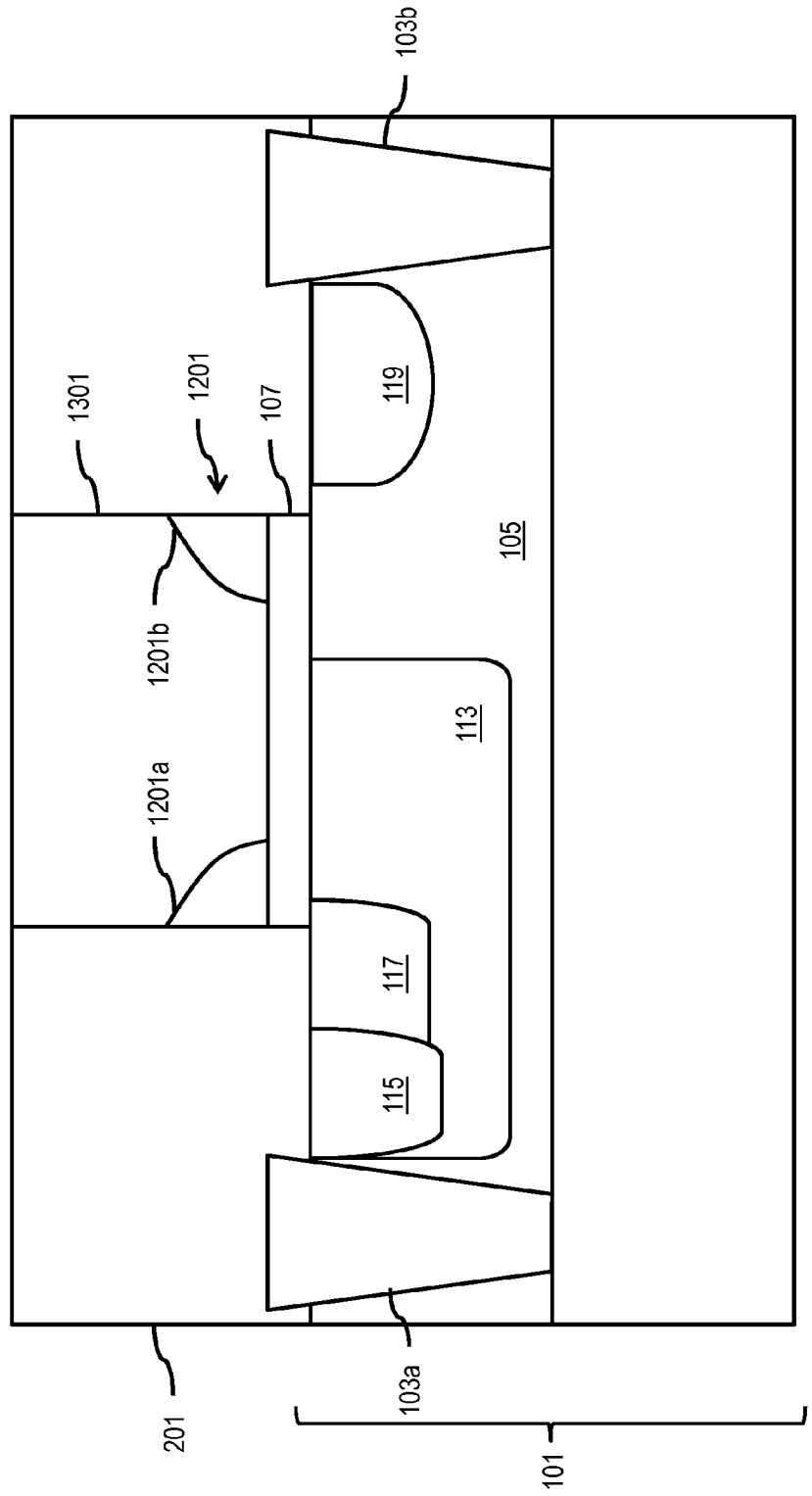

As illustrated in FIG. 13, the remaining cavity 1101 is filled with a gate material (e.g., poly-Si or metal) to form the gate 1301. As before, after depositing the gate material, CMP may be used to make the top surface of the gate 1301 co-planar with the ILD 201. In this embodiment, process steps are eliminated, as compared to the processes illustrated in FIGS. 1 through 9, such as the masking step and the partial removal of the self-adjusting threshold voltage layer 109.

Figure 14:
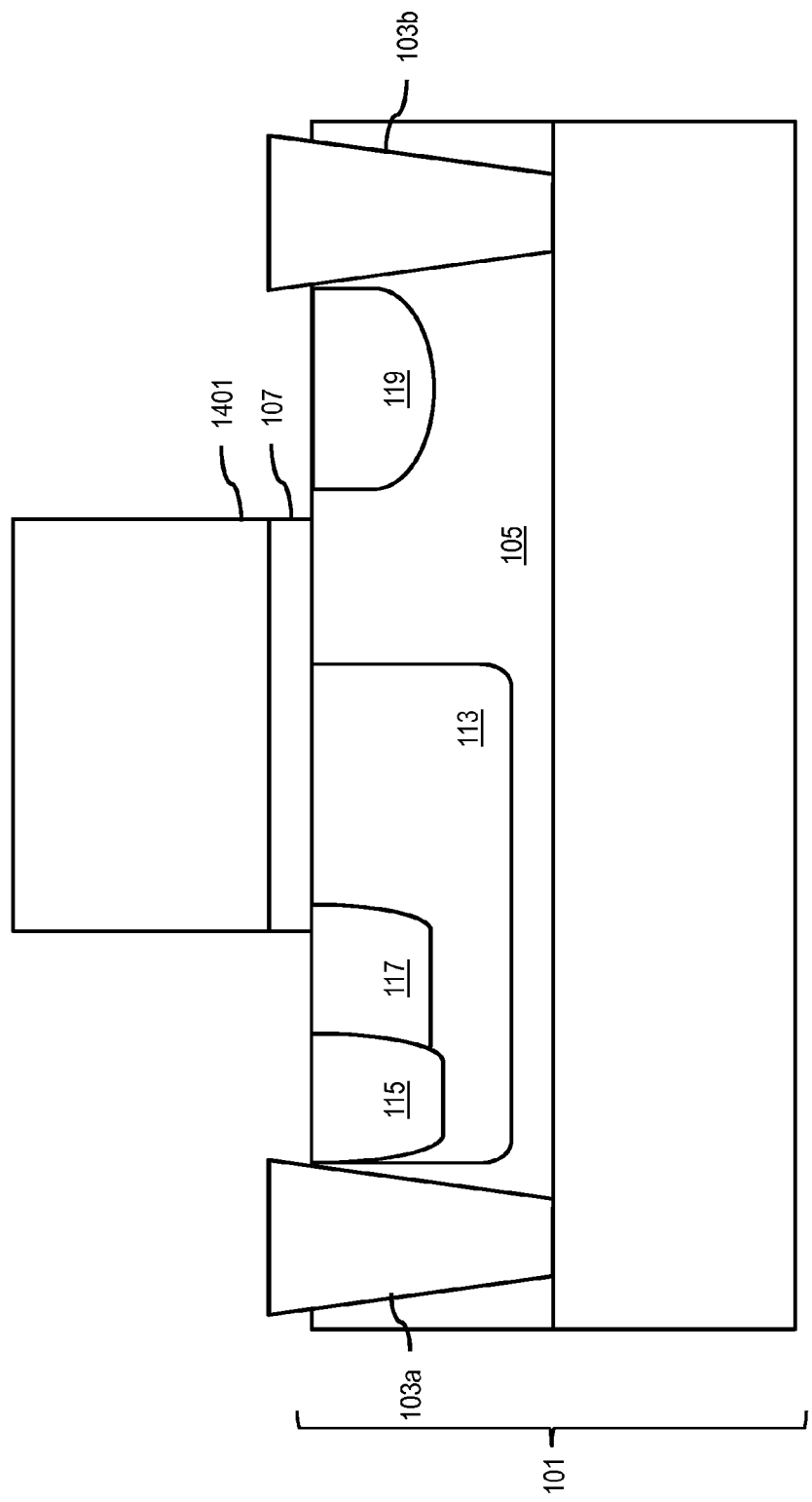
FIGS. 14 through 18 illustrate a method for forming another alternative self-adjusting threshold voltage FET structure, in accordance an exemplary embodiment.

Adverting to FIG. 14, a method for forming a FET with a partial self-adjusting threshold voltage layer, according to another exemplary embodiment, begins with the substrate 101, the STI regions 103, and a gate oxide layer 107 as discussed with respect to FIG. 1. The gate oxide layer 107 may be formed of any type of gate oxide material, such as $SiO_2$, and may be formed to a thickness of 25 to 100 nm. Directly above the gate oxide layer 107 is a gate 1401. The gate 1401 can be made from any gate material, such as poly-Si or metal. After forming the gate 1401, a drain region 119, a source region 117, and $p^+$ region 115 may be formed.

Figure 15:
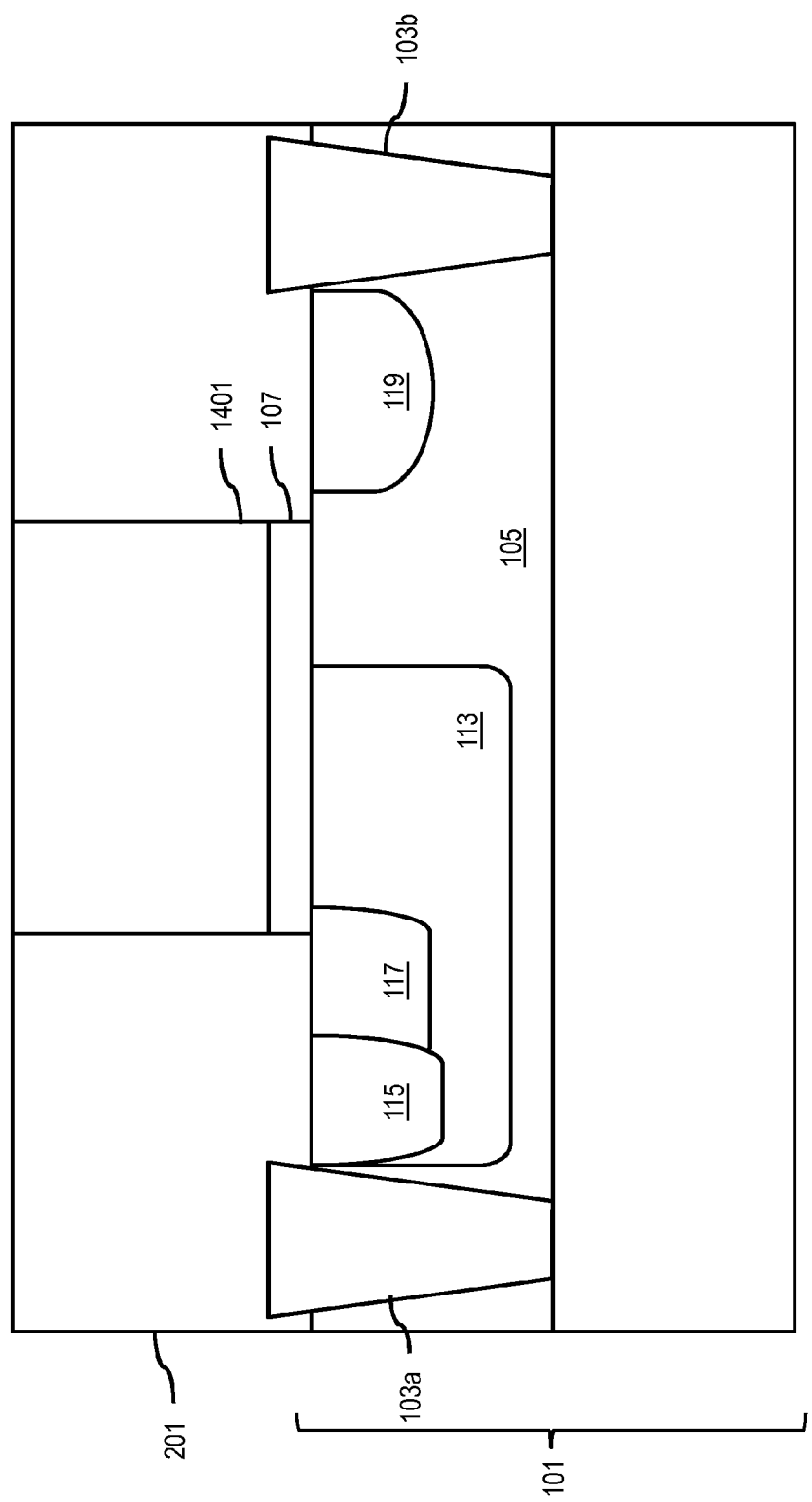

Next, as illustrated in FIG. 15, ILD 201 is formed over the substrate 101, the STI regions 103 and the gate 1401. The ILD 201 may be formed of any ILD material. After forming the ILD 201, CMP may be used to expose the gate 1401 and to form a top surface of the ILD 201 co-planar with the gate 1401.

Figure 16:
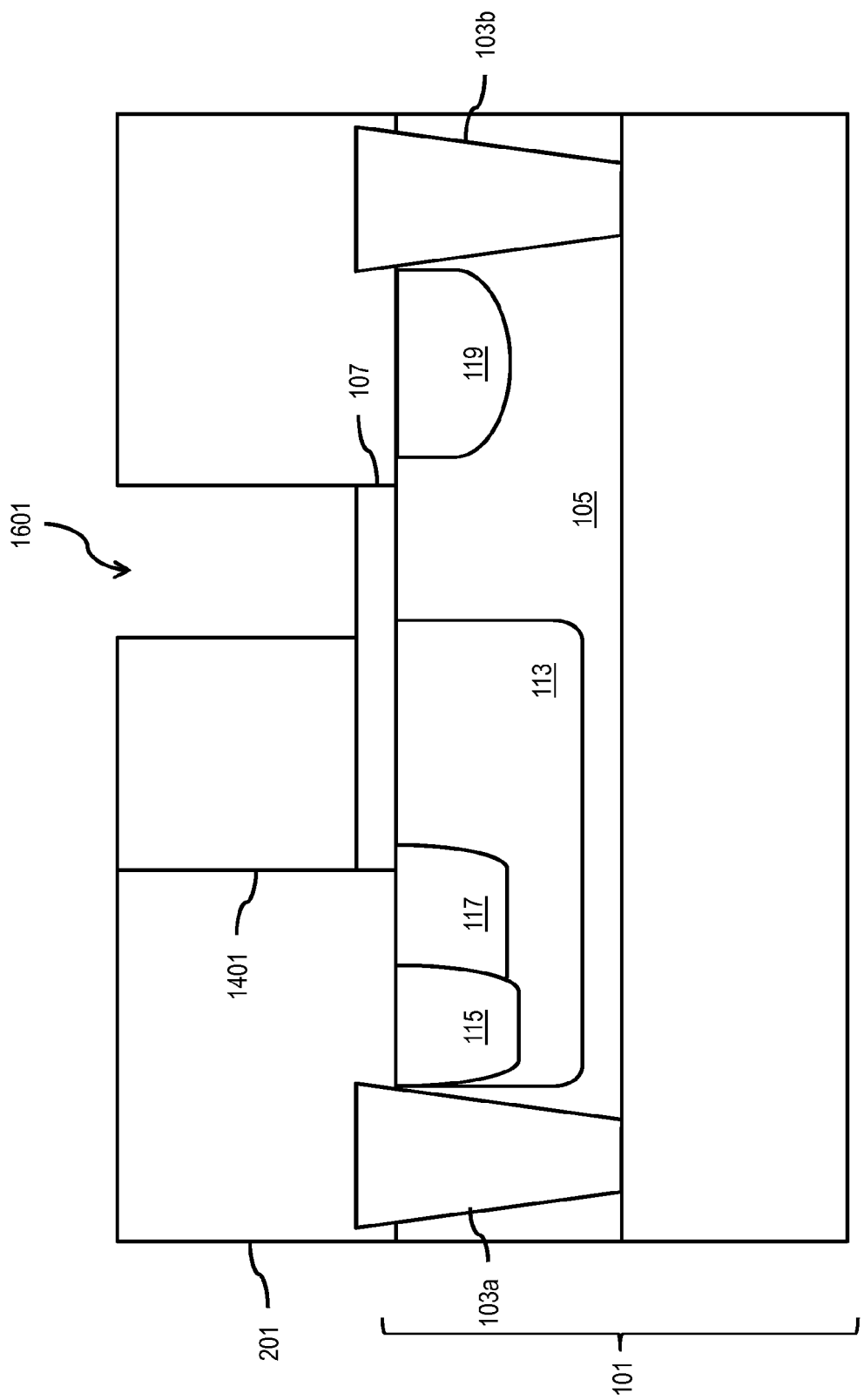

Adverting to FIG. 16, a portion of the gate 1401 is removed down to gate oxide layer 107, forming a cavity 1601 and exposing a portion of the gate oxide layer 107. The portion of the gate 1401 that is removed may be on the drain side of the gate 1401. The cavity 1601 may be 10 to 30% of the width of the gate 1401.

Figure 17:
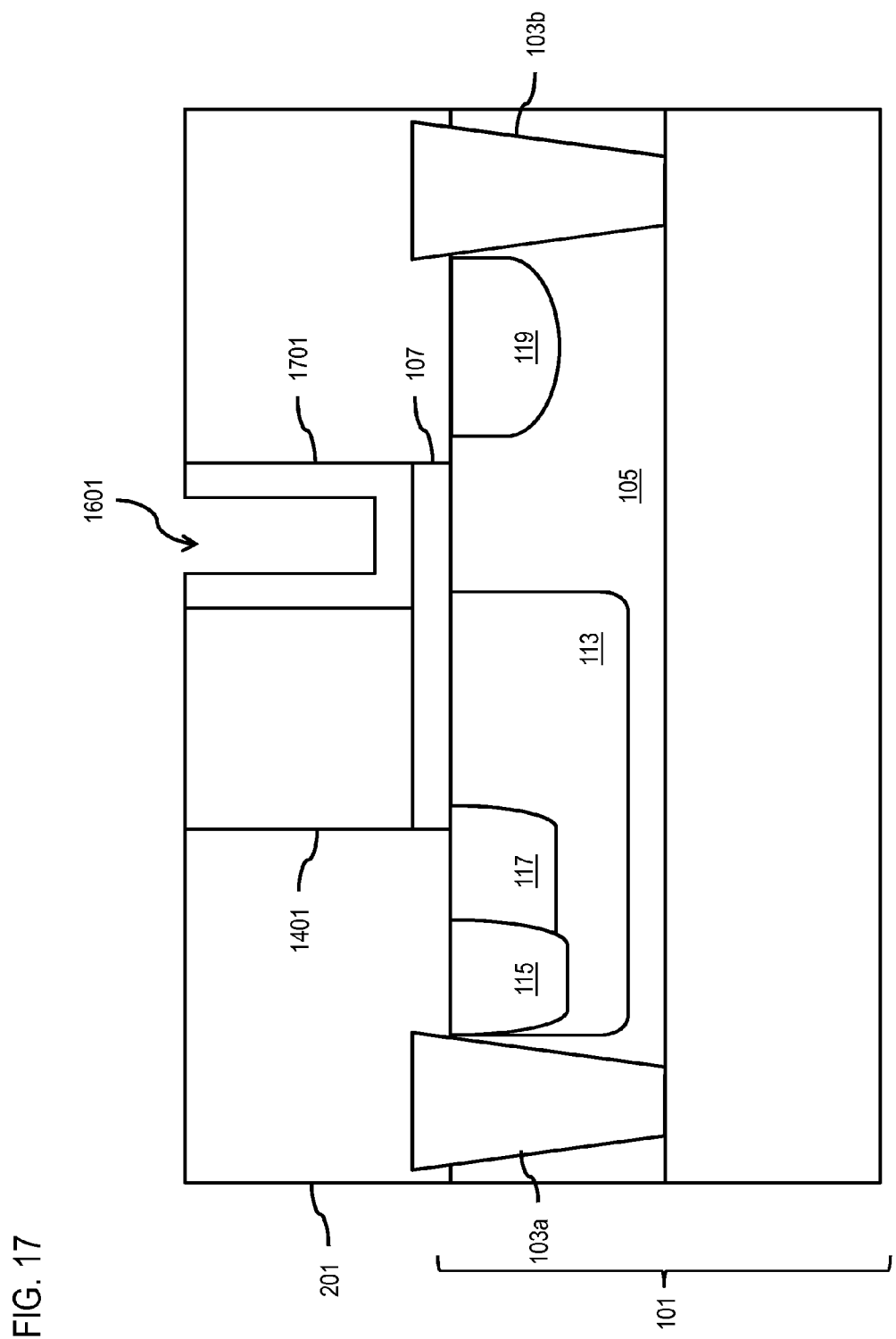
Figure 18:
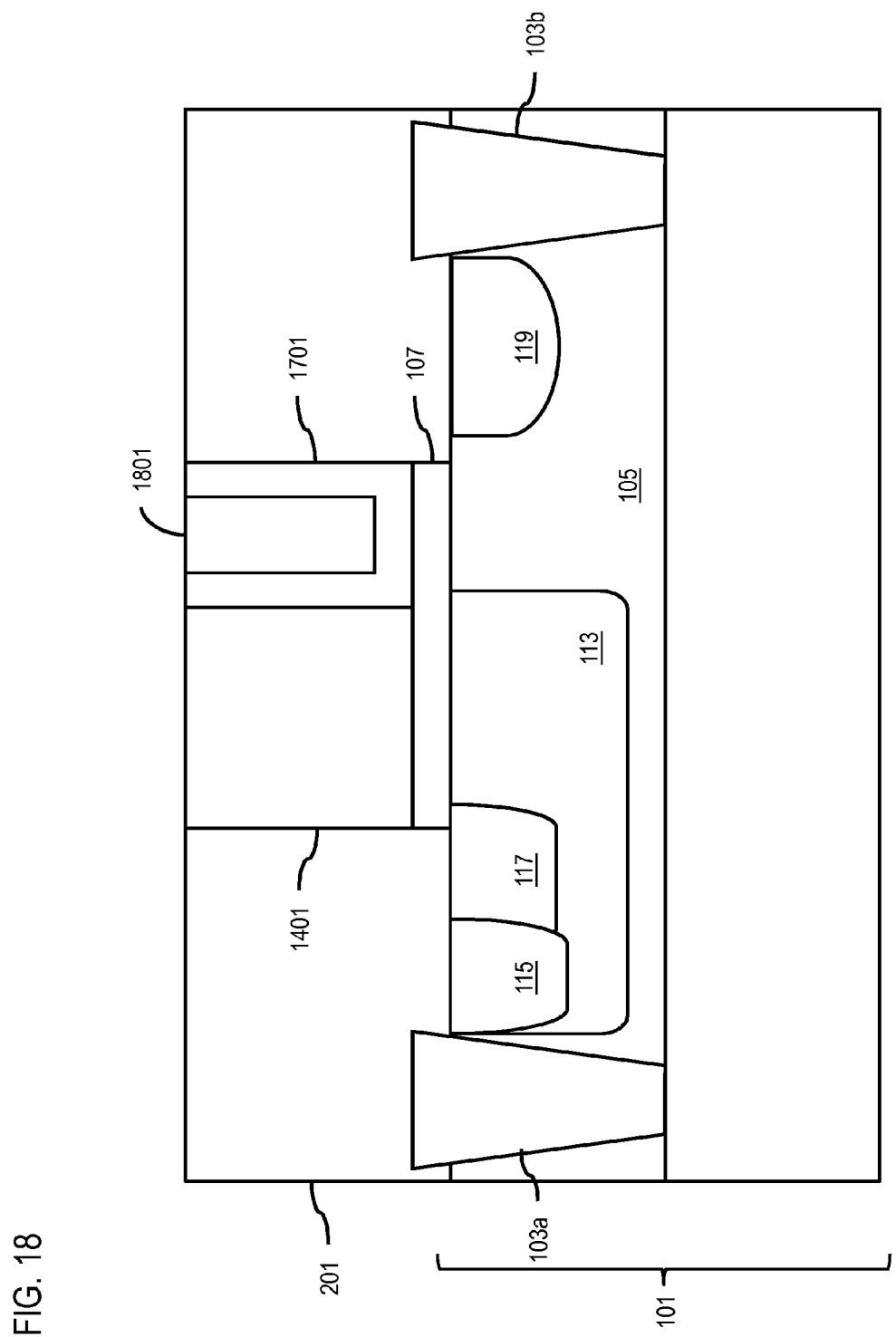

Next, a partial self-adjusting threshold voltage layer 1701 is conformally formed to line the cavity 1601, as illustrated in FIG. 17. The partial self-adjusting threshold voltage layer 1701 may be formed of a dielectric material (e.g., SiN) and/or a ferroelectric material and may be formed to a thickness of 1 to 10 nm. After forming the partial self-adjusting threshold voltage layer 1701, a field plate 1801 is formed in the remaining cavity 1601, as illustrated in FIG. 18. The field plate 1801 may be formed of poly-Si or a metal electrode. After forming the field plate 1801, CMP may be used to make the top surfaces of the field plate 1801 and the ILD 201 co-planar. The foregoing process of FIGS. 14 through 18 is compatible with current gate last CMOS processes with one extra masking step for partial gate removal.

Figure 19:
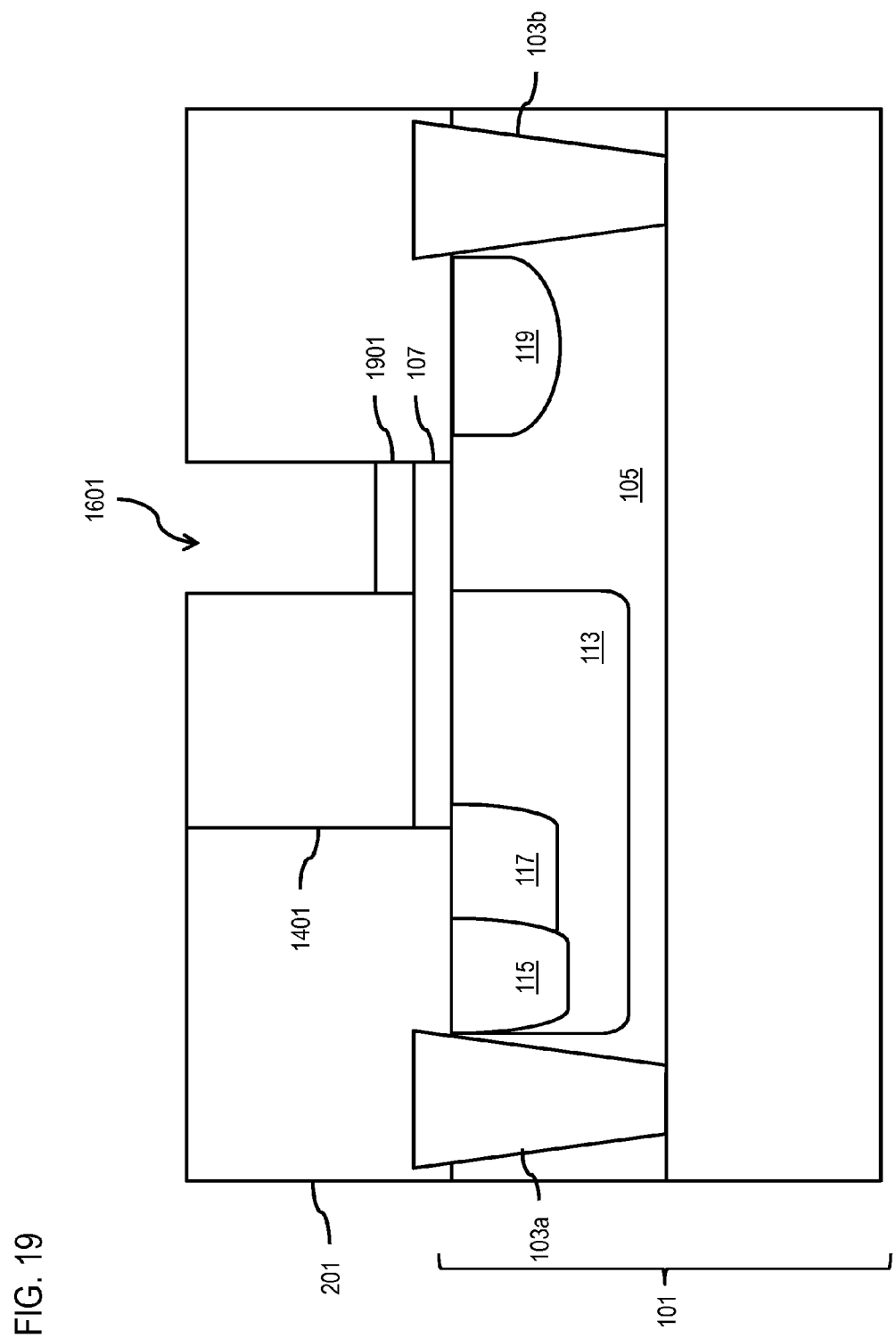
FIGS. 19 through 23 illustrate a method for forming yet another alternative self-adjusting threshold voltage FET structure, in accordance with an exemplary embodiment.
Figure 20:
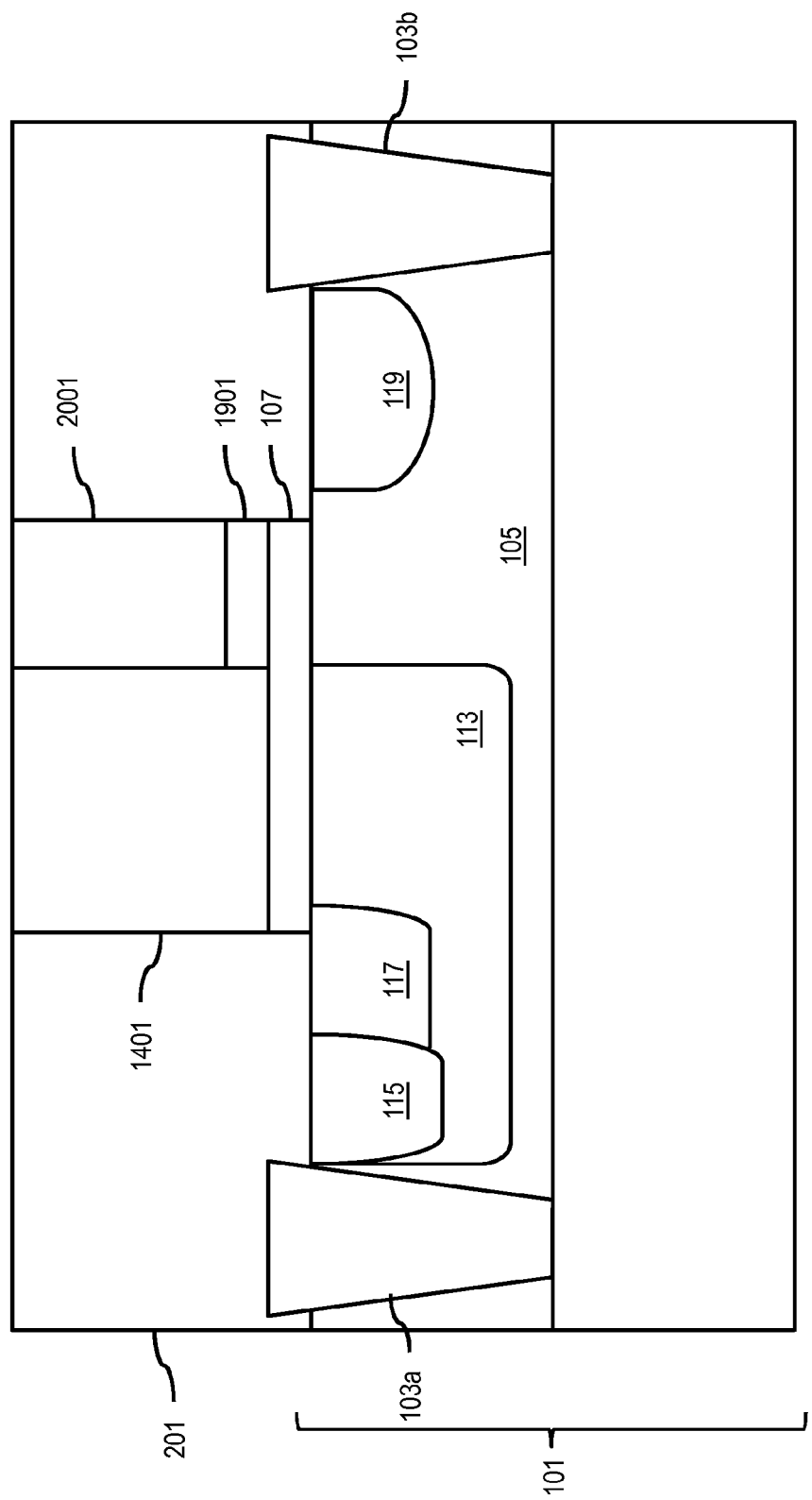

Adverting to FIG. 19, a method for forming a FET with a partial self-adjusting threshold voltage layer, according to another exemplary embodiment, begins substantially the same as FIGS. 14 through 16, described above. Then a partial self-adjusting threshold voltage layer 1901 is formed in cavity 1601 on the gate oxide layer 107. The partial self-adjusting threshold voltage layer 1901 may be formed of a dielectric material (e.g., SiN) and/or a ferroelectric material and may be formed to a thickness of 1 to 10 nm. After forming the partial self-adjusting threshold voltage layer 1901, a field plate 2001 is formed in the remaining cavity 1601, as illustrated in FIG. 20. The field plate 2001 may be formed of poly-Si or metal electrode. CMP may be used to make the top surfaces of the field plate 2001 and the ILD 201 co-planar.

Figure 21:
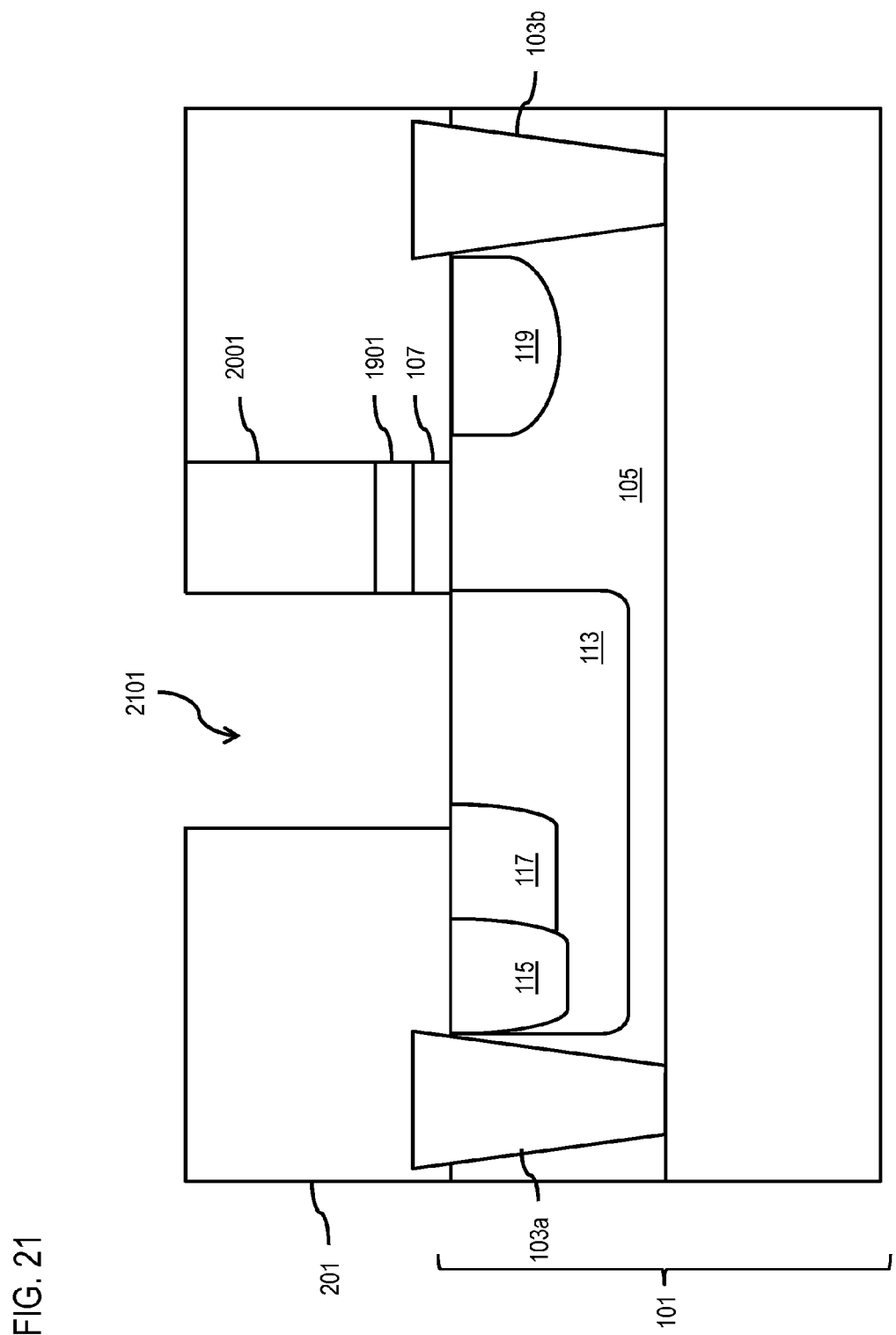
Figure 22:
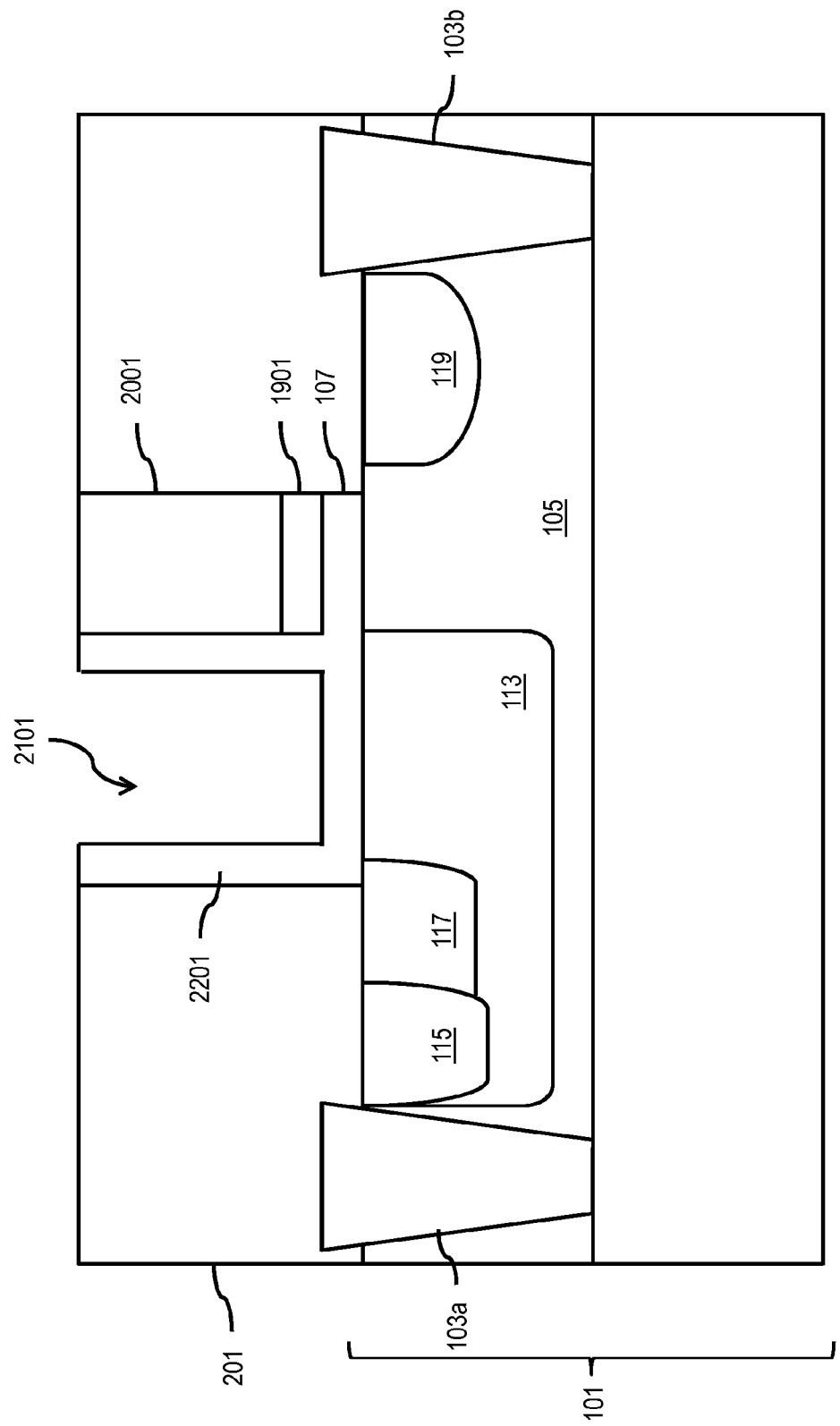
Figure 23:
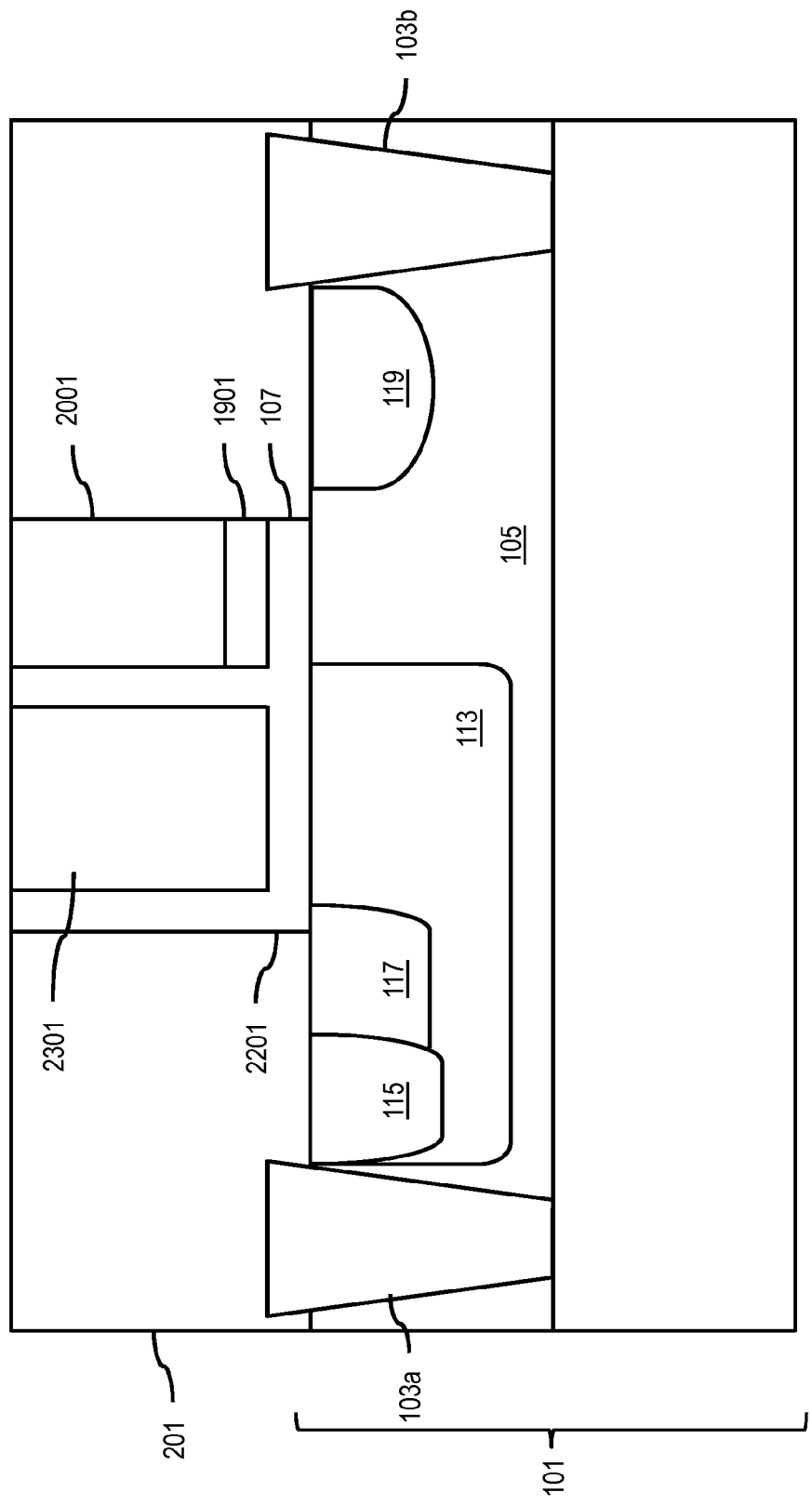

Next, as illustrated in FIG. 21, the remainder of the gate 1401 and the underlying gate oxide layer 107 are removed, and a cavity 2101 is formed adjacent the field plate 2001. A gate oxide 2201 may then be conformally deposited in cavity 2101, as illustrated in FIG. 22. The remainder of cavity 2101 may then be filled with a gate material to form gate 2301, as illustrated in FIG. 23. CMP and BEOL processes may follow.

The embodiments of the present disclosure achieve several technical effects, including FETs with lower equivalent oxide thicknesses (EOT) by having the partial self-adjusting threshold voltage function at source/drain edges and by maintaining the threshold voltage high and low at OFF and ON states, respectively, while reducing charging times. Further, when the FET is a LDMOS, at an OFF state, the partial self-adjusting threshold voltage layer serves as a typical field-plate at high voltage, which provides for better resistance when the FET is at saturation ($R_{dson}$) versus the breakdown voltage while keeping parasitic capacitance between the gate and the source/drain (Miller capacitance) low. Further, at an ON state, the partial self-adjusting threshold voltage layer makes the $R_{dson}$ lower and hence, there is a larger optimization room for $R_{dson}$ versus the breakdown voltage as compared to previous FETs. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for 22 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a gate oxide layer above a channel region in a substrate;
   forming a self-adjusting threshold voltage layer above the gate oxide layer;
   forming a dummy gate on the self-adjusting threshold voltage layer;
   removing the dummy gate, forming a cavity;
   depositing a gate material on side surfaces of the cavity, leaving exposed a middle portion of the self-adjusting threshold voltage layer; and
   removing the middle portion of the self-adjusting threshold voltage layer.

2. The method according to claim 1, further comprising:
   forming the self-adjusting threshold voltage layer above a source-side end and a drain-side end of the gate oxide layer.

3. The method according to claim 1, further comprising:
   after forming the dummy gate, forming an inter-layer dielectric (ILD) surrounding the gate oxide layer, the self-adjusting threshold voltage layer, and the dummy gate; and
   after removing at least the middle portion of the self-adjusting threshold voltage layer, filling the cavity with gate material to form a gate.

\* \* \* \* \*